US012796034B2

(12) United States Patent
Guha Neogi et al.

(10) Patent No.: US 12,796,034 B2
(45) Date of Patent: Nov. 10, 2026

(54) ELONGATED CONTACT FOR SOURCE OR DRAIN REGION

(71) Applicant: Intel Corporation, Santa Clara, CA (US)

(72) Inventors: Tuhin Guha Neogi, Hillsboro, OR (US); Hwichan Jun, Portland, OR (US); Francis Goodwin, Hillsboro, OR (US)

(73) Assignee: INTEL CORPORATION, Santa Clara, CA (US)

( * ) Notice: Subject to any disclaimer, the term of this patent is extended or adjusted under 35 U.S.C. 154(b) by 67 days.

(21) Appl. No.: 18/087,318

(22) Filed: Dec. 22, 2022

(65) Prior Publication Data

US 2024/0213324 A1 Jun. 27, 2024

(51) Int. Cl.

| | |
|---|---|
| ***H01L 29/10*** | (2006.01) |
| ***H10D 62/10*** | (2025.01) |
| ***H10D 62/17*** | (2025.01) |
| ***H10W 90/00*** | (2026.01) |

(52) U.S. Cl.

CPC ......... *H10D 62/299* (2025.01); *H10D 62/119* (2025.01); *H10D 62/393* (2025.01); *H10W 90/00* (2026.01)

(58) Field of Classification Search

CPC .. H10D 30/014; H10D 30/43; H10D 30/6735; H10D 62/119; H10D 62/121; H10D 62/299; H10D 62/393; H10D 64/0112; H10D 64/017; H10D 64/251; H10D 84/0186; H10D 84/038; H10D 84/85; H10W 90/00

See application file for complete search history.

(56) References Cited

U.S. PATENT DOCUMENTS

| | | | | |
|---|---|---|---|---|
| 2019/0123162 A1* | 4/2019 | Xie | ...................... | H10D 30/021 |
| 2019/0229196 A1* | 7/2019 | Sherazi | ................ | H10D 30/024 |
| 2020/0006160 A1* | 1/2020 | Lin | .................... | H10D 30/0243 |
| 2020/0091348 A1* | 3/2020 | Guha | ...................... | B82Y 10/00 |
| 2021/0358817 A1* | 11/2021 | Lin | .................... | H10D 30/0243 |
| 2022/0028786 A1* | 1/2022 | Huang | ................. | H10D 30/014 |
| 2023/0154992 A1* | 5/2023 | Lee | ...................... | H10D 64/258 257/368 |

OTHER PUBLICATIONS

Extended European Search Report received for EP Application No. 23195626.9—, dated Feb. 27, 2024. 12 pages.

* cited by examiner

*Primary Examiner* — Jaehwan Oh
(74) *Attorney, Agent, or Firm* — Arcane Law PLLC

(57) ABSTRACT

Techniques are provided herein to form semiconductor devices that include an elongated contact having two different heights on a source or drain region. A semiconductor device includes a gate structure around or otherwise on a semiconductor region (or channel region) that extends from a source or drain region. An elongated conductive contact is formed over the source or drain region that stretches or otherwise extends laterally across the source/drain trench above an adjacent source or drain region without contacting the adjacent source or drain region. A conductive via may contact the portion of the conductive contact over the adjacent source or drain region. Accordingly, the conductive contact may have a first thickness above the source or drain region and a second thickness above the adjacent source or drain region with the first thickness being greater than the second thickness.

20 Claims, 16 Drawing Sheets

ELONGATED CONTACT FOR SOURCE OR DRAIN REGION

FIELD OF THE DISCLOSURE

The present disclosure relates to integrated circuits, and more particularly, to interconnects made to source or drain regions.

BACKGROUND

As integrated circuits continue to scale downward in size, a number of challenges arise. For instance, reducing the size of memory and logic cells is becoming increasingly more difficult, as is reducing device spacing at the device layer. As transistors are packed more densely, the formation of certain interconnect structures can be challenging given the limited spacing and number of tracks used for a given interconnect layer. Accordingly, there remain a number of non-trivial challenges with respect to forming semiconductor devices.

Figure 1A:
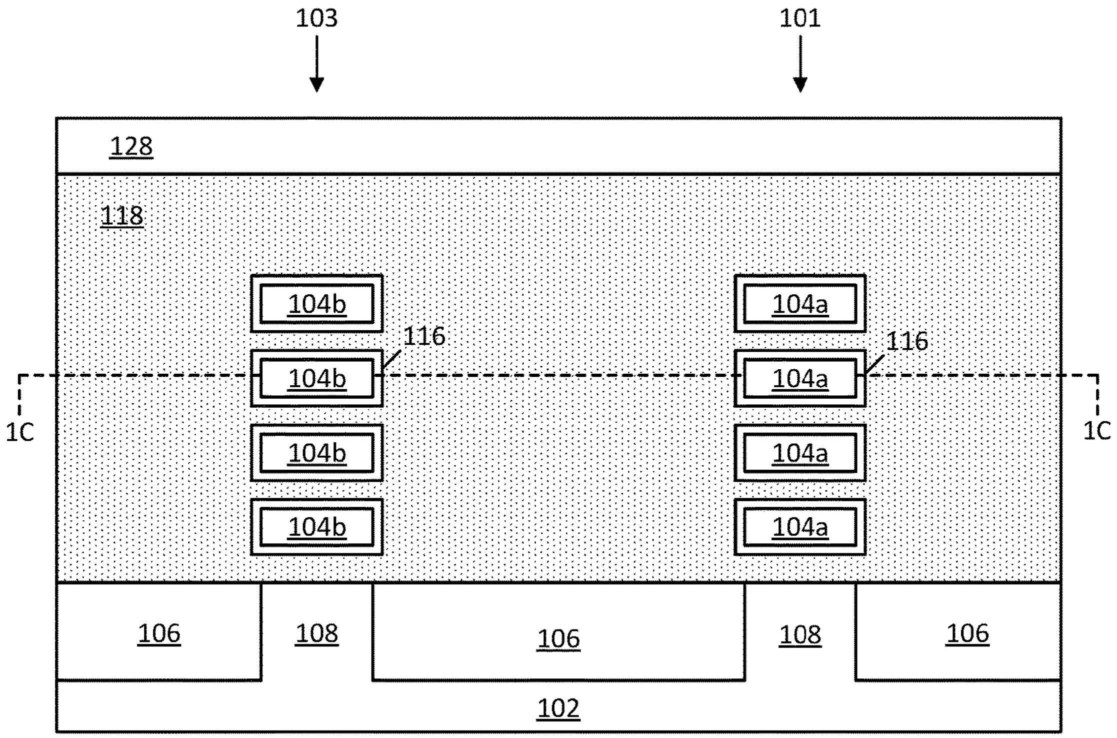
FIGS. 1A and 1B are cross-sectional views of some semiconductor devices that illustrate an elongated contact formed over a source or drain region, in accordance with an embodiment of the present disclosure.

Although the following Detailed Description will proceed with reference being made to illustrative embodiments, many alternatives, modifications, and variations thereof will be apparent in light of this disclosure. As will be further appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles (e.g., some features may have tapered sidewalls and/or rounded corners), and some features may have surface topology or otherwise be non-smooth, given real world limitations of the processing equipment and techniques used.

DETAILED DESCRIPTION

Techniques are provided herein to form semiconductor devices that include an elongated contact having two different heights on a source or drain region. The techniques can be used in any number of integrated circuit applications and are particularly useful with respect to device layer transistors, such as finFETs or gate-all-around transistors (e.g., ribbonFETs and nanowire FETs). In an example, a semiconductor device includes a gate structure around or otherwise on a semiconductor region (or channel region). The semiconductor region can be, for example, a fin of semiconductor material that extends from a source or drain region, or one or more nanowires or nanoribbons or nanosheets of semiconductor material that extend from the source or drain region (more generally, a diffusion region). An elongated conductive contact is formed over the source or drain region that extends laterally across the source/drain trench above an adjacent source or drain region without making contact with the adjacent source or drain region. A conductive via may make contact with the portion of the conductive contact over the adjacent source or drain region. Accordingly, the conductive contact may have a first thickness above the source or drain region and a second thickness above the adjacent source or drain region with the first thickness being greater than the second thickness (such as the example case where the first thickness is 5 nm or more greater than the second thickness). The elongated conductive contact may be used to route power or signal to the source or drain region using a specific track located above the adjacent source or drain region. Numerous variations and embodiments will be apparent in light of this disclosure.

General Overview

As previously noted above, there remain a number of non-trivial challenges with respect to integrated circuit fabrication. In more detail, as devices become smaller and more densely packed, many structures become more challenging to fabricate as critical dimensions (CD) of the structures push the limits of current fabrication technology. Interconnects can be particularly challenging with the number of connections to be made and a limited footprint. For many advanced libraries and certain cell designs, a limited number of parallel signal tracks may be used in a given interconnect layer (e.g., a first metal layer), such as only three signal tracks. In such architectures, it can be challenging to make connections between each of the various transistor elements to a limited number of signal tracks. For example, some connections cannot be made directly above a given element (such as a source or drain region) as it would cause a short with another element on the same track.

Thus, and in accordance with an embodiment of the present disclosure, an elongated conductive contact for a source or drain region is disclosed that laterally stretches or otherwise extends along a top portion of a source/drain trench to make contact with a via that is not directly located over the source or drain region. In some embodiments, the via may be located over another source or drain region (such as an adjacent source or drain region), where the conductive contact does not contact the other source or drain region. According to some embodiments, the elongated conductive contact may have a first height over the source or drain region that it contacts and a second height where it extends over an adjacent source or drain region, where the first height is greater than the second height. In some examples, the second height may be around half the height of the first height. In some embodiments, the first height may be between around 30 nm and around 40 nm and the second height may be between around 10 nm and around 20 nm. The conductive contact may include a conductive liner (or barrier layer) that extends around an outer surface of the conductive contact within the source/drain trench. In some embodiments, the conductive contact partially wraps around one or more sides of the source or drain region. Accordingly, a portion of the conductive contact along the one or more sides of the source or drain region may have a third height that is greater than the first height. Using the elongated conductive contact allows for easier lithography that alleviates patterning challenges (e.g., by using a mask with a greater critical dimension compared to prior techniques).

According to an embodiment, an integrated circuit includes a semiconductor device having a semiconductor region extending in a first direction from a source or drain region, and a gate structure extending in a second direction over the semiconductor region. The integrated circuit further includes a conductive contact on at least a top surface of the source or drain region. The conductive contact has a first section directly above the source or drain region and a second section extending away from the source or drain region such that the source or drain region is not below the second section. The first section has a first thickness and the second section has a second thickness with the first thickness being greater than the second thickness (e.g., by about 5 nm or more greater, or between about 10 nm and 25 nm greater).

According to another embodiment, an integrated circuit includes a first semiconductor device having a first semiconductor region extending in a first direction from a first source or drain region, and a second semiconductor device having a second semiconductor region extending in the first direction from a second source or drain region. The second source or drain region is adjacent to the first source or drain region along a second direction orthogonal to the first direction. The integrated circuit further includes a conductive contact on at least a top surface of the first source or drain region. The conductive contact has a first section directly above the first source or drain region and a second section extending away from the source or drain region and over, but not contacting, the second source or drain region. The first section has a first thickness and the second section has a second thickness with the first thickness being greater than the second thickness (e.g., about 5 nm to 30 nm greater).

According to another embodiment, a method of forming an integrated circuit includes forming a fin comprising semiconductor material, the fin extending above a substrate and extending in a first direction; forming a source or drain region at one end of the fin; forming a dielectric fill extending in a second direction over the source or drain region; forming a first recess through the dielectric fill and over the source or drain region, the first recess having a first height that exposes at least a top surface of the source or drain region; forming a second recess through the dielectric fill directly adjacent to the first recess, the second recess having a second height that is less than the first height; and forming a conductive contact within both the first recess and the second recess, such that the conductive contact contacts at least the top surface of the source or drain region.

The techniques can be used with any type of non-planar transistors, including finFETs (sometimes called tri-gate transistors), nanowire and nanoribbon transistors (sometimes called gate-all-around transistors), or forksheet transistors, to name a few examples. The source and drain regions can be, for example, doped portions of a given fin or substrate, or epitaxial regions that are deposited during an etch-and-replace source/drain forming process. The dopant-type in the source and drain regions will depend on the polarity of the corresponding transistor. The gate structure can be implemented with a gate-first process or a gate-last process (sometimes called a replacement metal gate, or RMG, process). Any number of semiconductor materials can be used in forming the transistors, such as group IV materials (e.g., silicon, germanium, silicon germanium) or group III-V materials (e.g., gallium arsenide, indium gallium arsenide).

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. For instance, in some example embodiments, such tools may indicate the presence of a conductive contact on a source or drain region that includes a thinner portion extending away from the rest of the conductive contact. In some embodiments, a conductive via is connected to the thinner portion of the conductive contact. In some embodiments, the thinner portion of the conductive contact extends above a second source or drain region and does not contact the second source or drain region.

It should be readily understood that the meaning of "above" and "over" in the present disclosure should be interpreted in the broadest manner such that "above" and "over" not only mean "directly on" something but also include the meaning of over something with an intermediate feature or a layer therebetween. Further, spatially relative terms, such as "beneath," "below," "lower," "above," "upper," "top," "bottom," and the like, may be used herein for ease of description to describe one element or feature's relationship to another element (s) or feature (s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "layer" refers to a material portion including a region with a thickness. A monolayer is a layer that consists of a single layer of atoms of a given material. A layer can extend over the entirety of an underlying or overlying structure, or may have an extent less than the extent of an underlying or overlying structure. Further, a layer can be a region of a homogeneous or inhomogeneous continuous structure, with the layer having a thickness less than the thickness of the continuous structure. For example, a layer can be located between any pair of horizontal planes between, or at, a top surface and a bottom surface of the continuous structure. A layer can extend horizontally, vertically, and/or along a tapered surface. A layer can be conformal to a given surface (whether flat or curvilinear) with a relatively uniform thickness across the entire layer.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer. If two materials are elementally different, then one of the materials has an element that is not in the other material.

Architecture

Figure 1B:
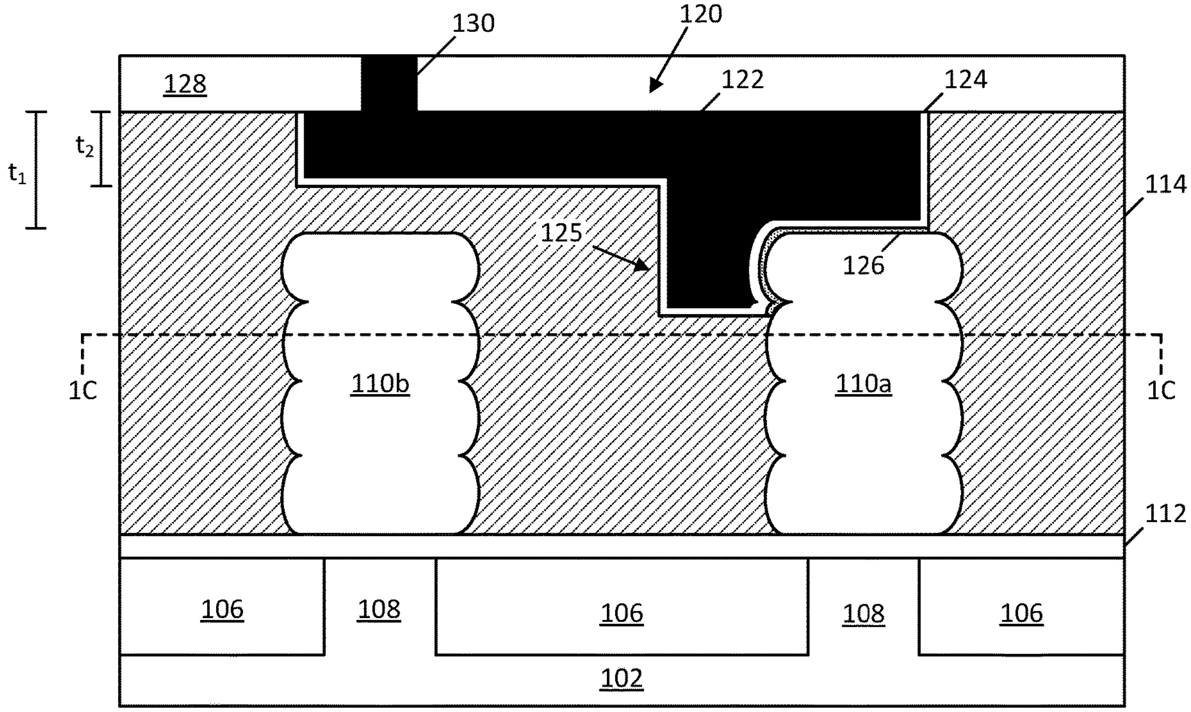
Figure 1C:
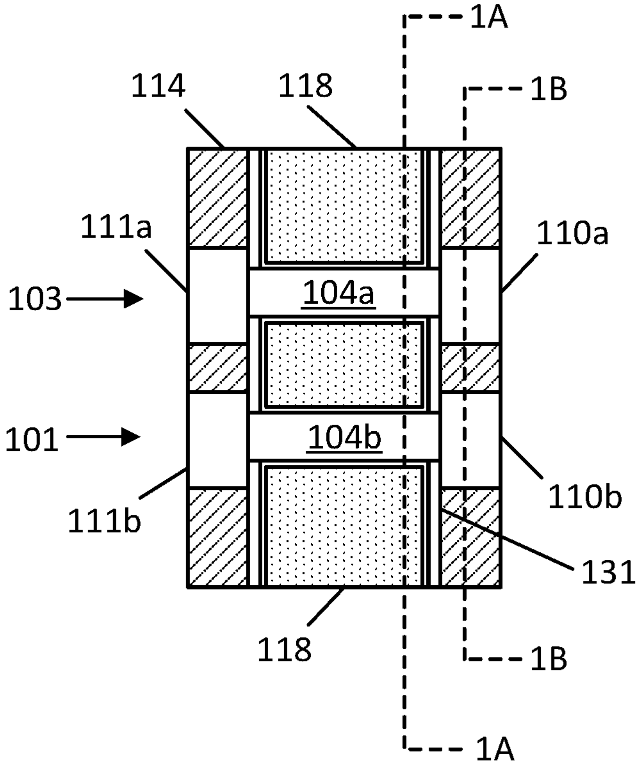
FIG. 1C is a plan view of the integrated circuit of FIGS. 1A and 1B, in accordance with an embodiment of the present disclosure.

FIG. 1A is a cross-sectional view taken across the gate trench of two example semiconductor devices, a first semiconductor device 101 and a second semiconductor device 103, according to an embodiment of the present disclosure. FIG. 1B is another cross-sectional view taken across the source/drain trench or diffusion region and contact trench adjacent to the gate trench either into or out of the page of FIG. 1A. FIG. 1C is a top-down cross-section view of the adjacent semiconductor devices 101 and 103 taken across the dashed line 1C-1C depicted in both FIG. 1A and FIG. 1B. FIG. 1A illustrates the cross-section taken across the dashed line 1A-1A depicted in FIG. 1C, and FIG. 1B illustrates the cross-section taken across the dashed line 1B-1B depicted in FIG. 1C. It should be noted that some of the material layers (such as dielectric layer 126) are not visible in the top-down view of FIG. 1C, given the location of the depicted cross-section.

Each of semiconductor devices 101 and 103 may be, for example, non-planar metal oxide semiconductor (MOS) transistors, such as tri-gate (e.g., finFET) or gate-all-around (GAA) transistors, although other transistor topologies and types could also benefit from the techniques provided herein. The illustrated example embodiments use the GAA structure. The various illustrated semiconductor devices represent a portion of an integrated circuit that may contain any number of similar semiconductor devices.

As can be seen, semiconductor devices 101 and 103 are formed on a substrate 102. Any number of semiconductor devices can be formed on substrate 102, but four are illustrated here as an example. Substrate 102 can be, for example, a bulk substrate including group IV semiconductor material (such as silicon, germanium, or silicon germanium), group III-V semiconductor material (such as gallium arsenide, indium gallium arsenide, or indium phosphide), and/or any other suitable material upon which transistors can be formed. Alternatively, substrate 102 can be a semiconductor-on-insulator substrate having a desired semiconductor layer over a buried insulator layer (e.g., silicon over silicon dioxide). Alternatively, substrate 102 can be a multilayer substrate or superlattice suitable for forming nanowires or nanoribbons (e.g., alternating layers of silicon and SiGe, or alternating layers indium gallium arsenide and indium phosphide). Any number of substrates can be used. In some embodiments, a lower portion of (or all of) substrate 102 is removed and replaced with one or more backside interconnect layers to form backside signal and power routing, during a backside process.

Each of semiconductor devices 101 and 103 includes one or more corresponding nanoribbons 104*a* and 104*b*, respectively, that extend parallel to one another along a direction between corresponding source or drain regions, as seen more clearly in FIG. 1C (e.g., a first direction into and out of the page in the cross-section view of FIG. 1A). Accordingly, nanoribbons 104*a* extend between source or drain region 110*a* and source or drain region 111*a* and nanoribbons 104*b* extend between source or drain region 110*b* and source or drain region 111*b*. Nanoribbons 104*a*/104*b* are one example of semiconductor regions or semiconductor bodies that extend between source or drain regions. The term nanoribbon may also encompass other similar shapes such as nanowires or nanosheets. The semiconductor material of nanoribbons 104*a*/104*b* may be formed from substrate 102. In some embodiments, semiconductor devices 101 and 103 may each include semiconductor regions in the shape of fins that can be, for example, native to substrate 102 (formed from the substrate itself), such as silicon fins etched from a bulk silicon substrate. Alternatively, the fins can be formed of material deposited onto an underlying substrate. In one such example case, a blanket layer of silicon germanium (SiGe) can be deposited onto a silicon substrate, and then patterned and etched to form a plurality of SiGe fins extending from that substrate. In another such example, non-native fins can be formed in a so-called aspect ratio trapping based process, where native fins are etched away so as to leave fin-shaped trenches which can then be filled with an alternative semiconductor material (e.g., group IV or III-V material). In still other embodiments, the fins include alternating layers of material (e.g., alternating layers of silicon and SiGe) that facilitate forming of the illustrated nanoribbons 104*a*/104*b* during a gate forming process where one type of the alternating layers is selectively etched away so as to liberate the other type of alternating layers within the channel region, so that a gate-all-around (GAA) process can then be carried out. Again, the alternating layers can be blanket deposited and then etched into fins or deposited into fin-shaped trenches.

As can further be seen, adjacent semiconductor devices are separated by a dielectric fill 106. Dielectric fill 106 provides shallow trench isolation (STI) between any adjacent semiconductor devices. Dielectric fill 106 can be any suitable dielectric material, such as silicon dioxide, aluminum oxide, or silicon oxycarbonitride.

Semiconductor devices 101 and 103 each include a subfin region 108. According to some embodiments, subfin region 108 comprises the same semiconductor material as substrate 102 and is adjacent to dielectric fill 106. According to some embodiments, nanoribbons 104*a*/104*b* (or other semiconductor bodies) extend between source or drain regions 110*a*/110*b* in the first direction to provide an active region (sometimes called channel region) for a transistor (e.g., the semiconductor region beneath the gate). It should be understood that the source or drain regions 110*a*/110*b* illustrated in the cross-section of FIG. 1B are only along one side of nanoribbons 104*a*/104*b* (e.g., out of the page of FIG. 1A) and that similar source or drain regions 111*a*/111*b* may be present along the opposite side of nanoribbons 104*a*/104*b*, as shown in FIG. 1C.

According to some embodiments, the source or drain regions are epitaxial regions that are provided using an etch-and-replace process. In other embodiments the source or drain regions could be, for example, implantation-doped native portions of the semiconductor fins or substrate. Any semiconductor materials suitable for source and drain regions can be used (e.g., group IV and group III-V semiconductor materials). The composition and doping of the source or drain regions may be the same or different, depending on the polarity of the transistors. In an example, for instance, one transistor is a p-type MOS (PMOS) transistor, and the other transistor is an n-type MOS (NMOS) transistor. As such, source or drain region 110*a* may have a different dopant type (n or p) compared to source or drain region 110*b*. Any number of source or drain configurations and materials can be used.

According to some embodiments, a lower dielectric layer 112 exists beneath source or drain regions 110*a*/110*b*. Lower dielectric layer 112 can include any suitable dielectric material, such as silicon dioxide or silicon nitride or silicon oxynitride and may be provided to isolate source or drain regions 110*a*/110*b* from subfin regions 108. According to some embodiments, another dielectric fill 114 is provided around and over portions of source or drain regions 110*a*/110*b* along the source/drain trench after epitaxial formation of the source/drain regions is complete. Accordingly, each source or drain region may be isolated from any adjacent source or drain regions by dielectric fill 114. Dielectric fill 114 may be any suitable dielectric material, although in some embodiments, dielectric fill 114 includes the same dielectric material as dielectric fill 106 or lower dielectric layer 112. In one example, each of dielectric fill 114, lower dielectric layer 112, and dielectric fill 106 includes silicon dioxide.

According to some embodiments, a gate structure extends over nanoribbons 104*a*/104*b* of semiconductor devices 101 and 103 along a second direction across the page. The gate structure includes a gate dielectric 116 and a gate layer (or gate electrode) 118. Gate dielectric 116 represents any number of dielectric layers present between nanoribbons 104*a*/104*b* and gate electrode 118. Gate dielectric 116 may also be present on the surfaces of other structures within the gate trench, such as on subfin regions 108. Gate dielectric 116 may include any suitable gate dielectric material(s). In some embodiments, gate dielectric 116 includes a layer of native oxide material (e.g., silicon dioxide) on the nanoribbons or other semiconductor regions making up the channel region of the devices, and a layer of high-k dielectric material (e.g., hafnium oxide) on the native oxide.

Gate electrode 118 may represent any number of conductive layers, such as any metal, metal alloy, or doped polysilicon layers. In some embodiments, gate electrode 118 includes one or more workfunction metals around nanoribbons 104*a*/104*b*. In some embodiments, one of semiconductor devices 101 and 103 is a p-channel device that includes a workfunction metal having titanium around its nanoribbons and the other semiconductor device is an n-channel device that includes a workfunction metal having tungsten around its nanoribbons. Gate electrode 118 may also include a fill metal or other conductive material around the workfunction metals to provide the whole gate electrode structure. According to some embodiments, a dielectric gate cut is present between semiconductor devices 101 and 103 such that a first gate structure is present over nanoribbons 104*a* and a second gate structure is present over nanoribbons 104*b*.

According to some embodiments, a conductive contact 120 includes a first section on or over source or drain region 110*a* and a second section that extends away from the first section and over adjacent source or drain region 110*b*. According to some embodiments, each of the first and second sections of conductive contact 120 includes a conductive fill 122 and a conductive liner 124 along outside edges of conductive fill 122. Conductive fill 122 may be any suitably conductive material such as tungsten (W). Other conductive materials may include copper (Cu), ruthenium (Ru), cobalt (Co), titanium (Ti), molybdenum (Mo), or any alloys thereof. Conductive liner 124 may be, for instance, a barrier layer and/or resistance-reducing layer that includes titanium or tantalum (e.g., titanium nitride or tantalum nitride) or some other suitable liner layer. Conductive liner 124 may have a thickness, for example, between about 1 nm and about 3 nm. Other examples may not have conductive liner 124.

According to some embodiments, the first section of conductive contact 120 above source or drain region 110*a* has a first thickness $t_1$ and the second section of conductive contact extending away from the first section has a second thickness $t_2$. In some examples, the first thickness $t_1$ is between about 30 nm and about 40 nm and the second thickness $t_2$ is between about 10 nm and about 20 nm. More generally, the first thickness $t_1$ may be at least 5 nm greater, or two times greater, than the second thickness $t_2$, according to some embodiments. Due to its smaller thickness, the second section of conductive contact 120 may extend above adjacent source or drain region 110*b* without contacting it.

The second section of conductive contact 120 may extend over any other semiconductor structure or may not extend over any semiconductor structures, according to some embodiments. According to some embodiments, both the first and second sections of conductive contact 120 have a planar top surface that is substantially coplanar with a top surface of dielectric fill 114 along the source/drain trench.

According to some embodiments, a portion of conductive contact 120 may extend partially along one or more sides of source or drain region 110*a* forming a foot structure 125. Accordingly, foot structure 125 may have a greater total thickness (e.g., measured from the top surface of conductive contact 120) than the thickness ($t_1$) of the first section of conductive contact 120. Foot structure 125 may be formed around opposite sides of source or drain region 110*a*, according to some embodiments.

In some embodiments, a conductive layer 126 may be present along an outer surface of source or drain regions 110*a*, such that conductive layer 126 is present between source or drain region 110*a* and conductive contact 120. Conductive layer 126 may be, for example, a silicide or germanide or other highly conductive material that forms at the semiconductor-metal interface, and may be used to further reduce the contact resistance between source or drain region 110*a* and conductive contact 120.

In any such embodiments, the conductive fill 122 of the first and second sections of conductive contact 120 may be a continuous and monolithic body of tungsten or other conductive fill material, such that there are no seams or grain boundaries between the first and second sections. Similarly, the conductive liner 124 may run continuously along the first and second sections of conductive contact 120. This is because, according to some embodiments, the conductive liner 124 is formed in the first and second sections of conductive contact 120 at the same time and with the same liner deposition process, and the conductive fill 122 is formed in the first and second sections of conductive contact 120 at the same time and with the same fill deposition process. Any excess deposition can be polished away using, for example, chemical mechanical polishing (CMP).

According to some embodiments, an interconnect layer may be formed over the semiconductor devices that includes a dielectric layer 128 and a conductive via 130 through dielectric layer 128. Dielectric layer 128 may be any suitable dielectric material, such as silicon dioxide. Conductive via 130 may include the same conductive material as conductive contact 120 and/or any of the conductive materials listed above for conductive contact 120. In one example, conductive via 130 includes tungsten. According to some embodiments, conductive via 130 contacts the second section of conductive contact 120, such that conductive via 130 is not located directly over source or drain region 110*a*. Accordingly, conductive contact 120 may be used to route signal or power between source or drain region 110*a* and conductive via 130 where conductive via 130 is not located directly above source or drain region 110*a*. In some examples, conductive via 130 may be located directly above another semiconductor structure (such as source or drain region 110*b*) or directly above no semiconductor structures.

FIG. 1C illustrates a plan view of the integrated circuit showing how nanoribbons 104*a* extend between source or drain regions 110*a* and 111*a* and how nanoribbons 104*b* extend between source or drain regions 110*b* and 111*b*. According to some embodiments, spacer structures 131 extend along the sides of the gate trench and isolate the gate trench from the source/drain trench (including epi regions and their respective contacts). Spacer structures 131 may include any suitable dielectric material, such as silicon nitride. The nanoribbons 104*a*/104*b* (or other channel body) extend through spacer structures 131 to contact respective source or drain regions.

Fabrication Methodology

FIGS. 2A-12A and 2B-12B are cross-sectional views that collectively illustrate a first example process for forming an integrated circuit configured with an elongated conductive contact on a source or drain region, in accordance with an embodiment of the present disclosure. FIGS. 2A-12A represent cross-sectional views taken across a gate trench of the integrated circuit, while FIGS. 2B-12B represent cross-sectional views taken across the source/drain trench adjacent to the gate trench along the same direction. Each figure shows an example structure that results from the process flow up to that point in time, so the depicted structure evolves as the process flow continues, culminating in the structure shown in FIGS. 12A and 12B, which is similar to the structure shown in FIGS. 1A and 1B, respectively. Such a structure may be part of an overall integrated circuit (e.g., such as a processor or memory chip) that includes, for example, digital logic cells and/or memory cells and analog mixed signal circuitry. Thus, the illustrated integrated circuit structure may be part of a larger integrated circuit that includes other integrated circuitry not depicted. Example materials and process parameters are given, but the present disclosure is not intended to be limited to any specific such materials or parameters, as will be appreciated. Figures sharing the same number (e.g., FIGS. 2A and 2B) illustrate different views of the structure at the same point in time during the process flow. Although the fabrication of a single conductive contact is illustrated in the aforementioned figures, it should be understood that any number of similar conductive contacts can be fabricated across the integrated circuit using the same processes discussed herein.

Figure 2A:
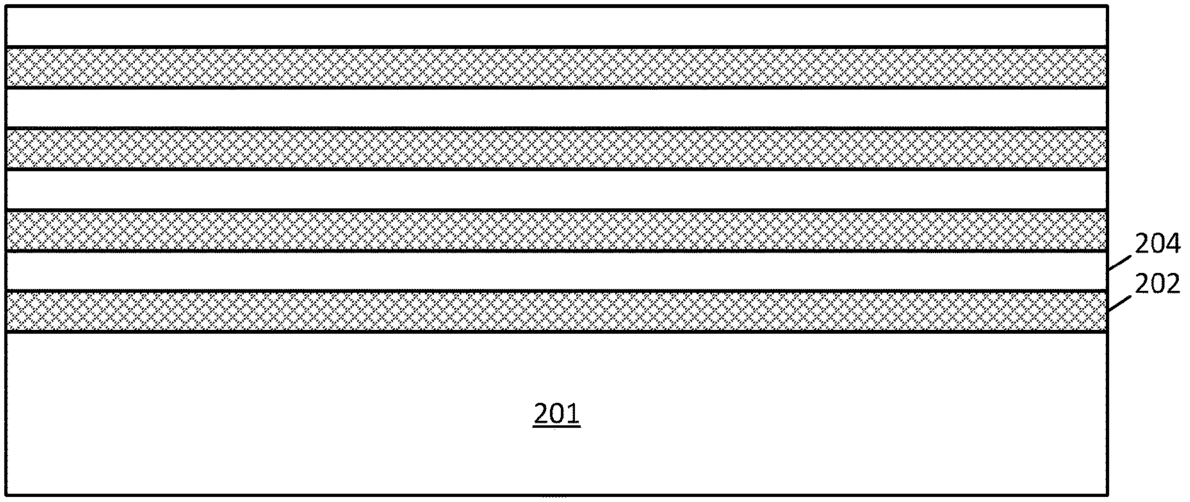
FIGS. 2A and 2B are cross-sectional views that illustrate a stage in an example process for forming semiconductor devices that have an elongated contact formed over a source or drain region, in accordance with some embodiments of the present disclosure.
Figure 2B:
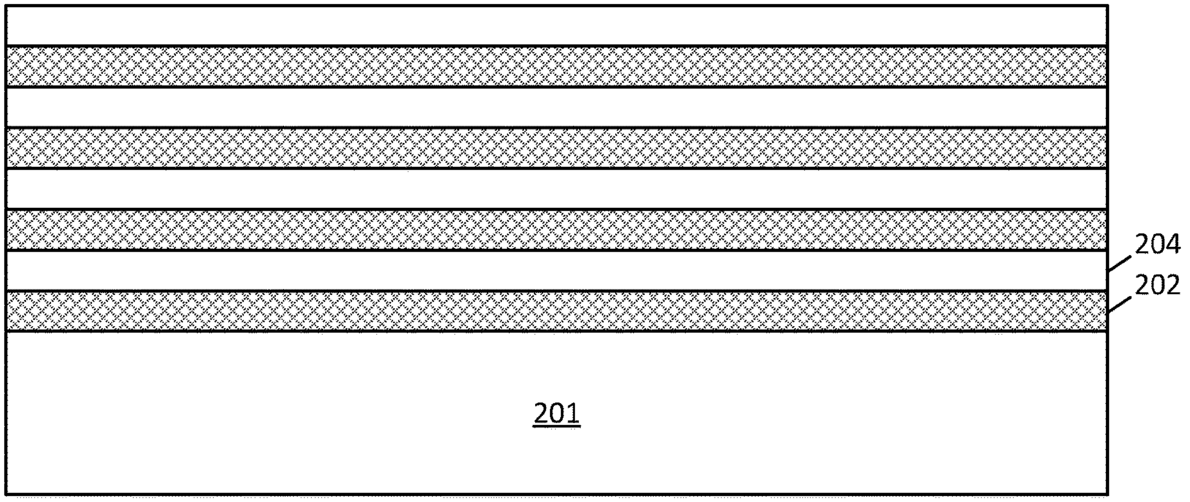

FIGS. 2A and 2B illustrate parallel cross-sectional views taken through a stack of alternating semiconductor layers on a semiconductor substrate 201. FIG. 2A is taken across a portion of the stack that will eventually become a gate trench while FIG. 2B is taken across a portion of the stack that will eventually become a source/drain trench adjacent and parallel to the gate trench. Alternating material layers may be deposited over substrate 201 including sacrificial layers 202 alternating with semiconductor layers 204. The alternating layers are used to form GAA transistor structures. Any number of alternating semiconductor layers 204 and sacrificial layers 202 may be deposited over substrate 201. The description above for substrate 102 applies equally to substrate 201.

According to some embodiments, sacrificial layers 202 have a different material composition than semiconductor layers 204. In some embodiments, sacrificial layers 202 are silicon germanium (SiGe) while semiconductor layers 204 include a semiconductor material suitable for use as a nanoribbon such as silicon (Si), SiGe, germanium, or III-V materials like indium phosphide (InP) or gallium arsenide (GaAs). In examples where SiGe is used in each of sacrificial layers 202 and in semiconductor layers 204, the germanium concentration is different between sacrificial layers 202 and semiconductor layers 204. For example, sacrificial layers 202 may include a higher germanium content compared to semiconductor layers 204. In some examples, semiconductor layers 204 may be doped with either n-type dopants (to produce a p-channel transistor) or p-type dopants (to produce an n-channel transistor).

While dimensions can vary from one example embodiment to the next, the thickness of each sacrificial layer 202 may be between about 5 nm and about 20 nm. In some embodiments, the thickness of each sacrificial layer 202 is substantially the same (e.g., within 1-2 nm), and the thickness of each of semiconductor layers 204 may be about the same as the thickness of each sacrificial layer 202 (e.g., about 5-20 nm). Each of sacrificial layers 202 and semiconductor layers 204 may be deposited using any known or proprietary material deposition technique, such as chemical vapor deposition (CVD), plasma-enhanced chemical vapor deposition (PECVD), physical vapor deposition (PVD), or atomic layer deposition (ALD).

Figure 3A:
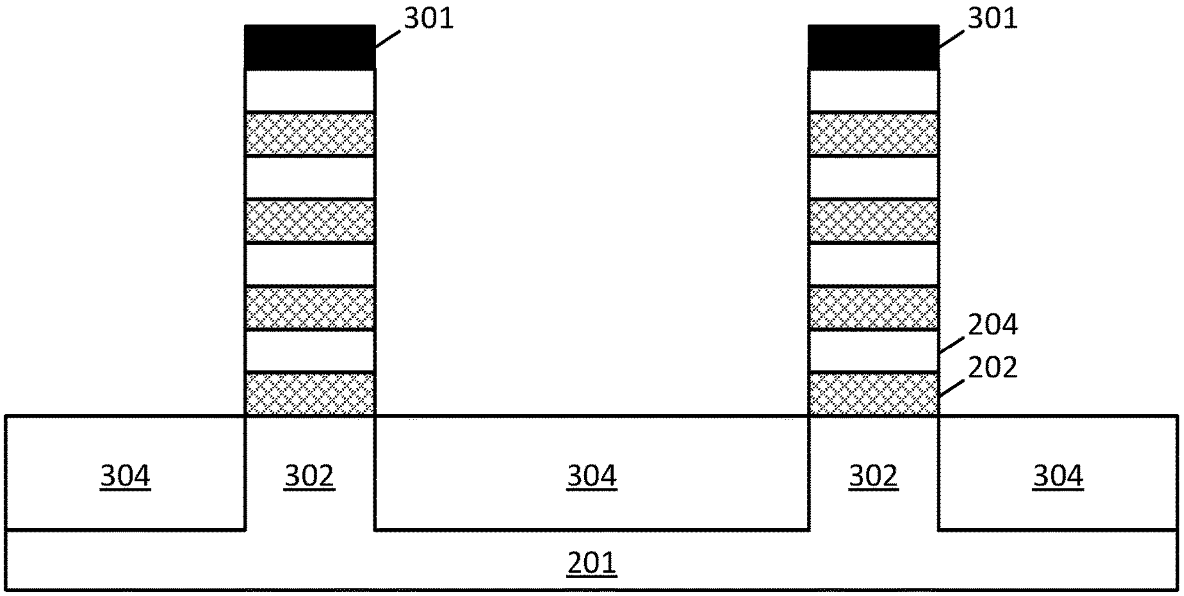
FIGS. 3A and 3B are cross-sectional views that illustrate another stage in the example process for forming semiconductor devices that have an elongated contact formed over a source or drain region, in accordance with some embodiments of the present disclosure.
Figure 3B:
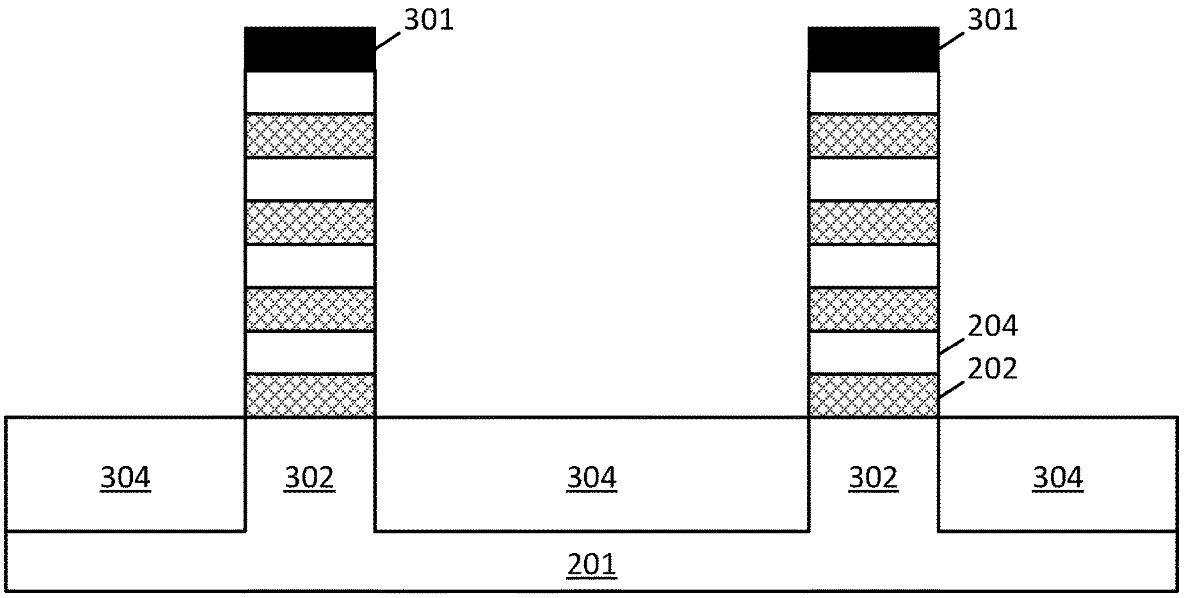

FIGS. 3A and 3B depict the cross-section views of the structure shown in FIGS. 2A and 2B, respectively, following the formation of a cap layer 301 and the subsequent formation of fins beneath cap layer 301, according to an embodiment. Cap layer 301 may be any suitable hard mask material such as a carbon hard mask (CHM) or silicon nitride. Cap layer 301 is patterned into rows to form corresponding rows of fins from the alternating layer stack of sacrificial layers 202 and semiconductor layers 204. The rows of fins extend lengthwise in a first direction (e.g., into and out of the page of each cross-section view).

According to some embodiments, an anisotropic etching process through the layer stack continues into at least a portion of substrate 201, where the unetched portions of substrate 201 beneath the fins form subfin regions 302. The etched portions of substrate 201 may be filled with a dielectric fill 304 that acts as shallow trench isolation (STI) between adjacent fins. Dielectric fill 304 may be any suitable dielectric material such as silicon dioxide, and may be recessed to a desired depth as shown (in this example case, down to around the upper surface of subfin regions 302), so as to define the active portion of the fins that will be covered by a gate structure. In some embodiments, dielectric fill 304 is recessed below the top surface of subfin regions 302.

Figure 4A:
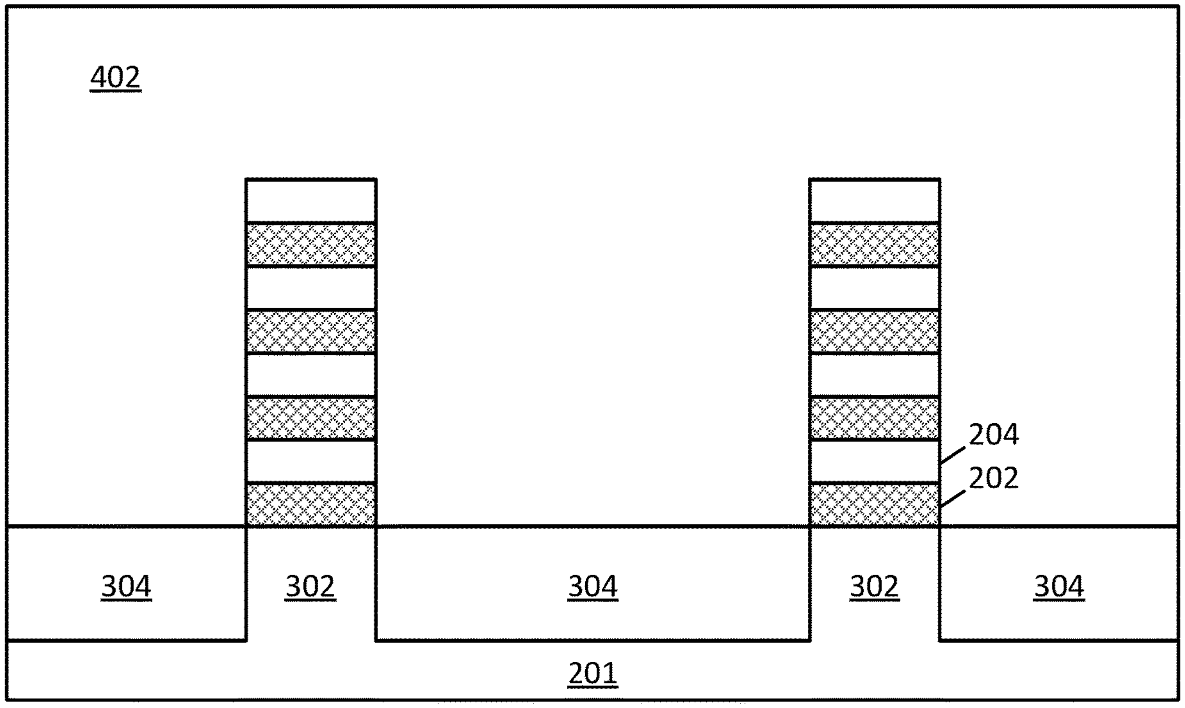
FIGS. 4A and 4B are cross-sectional views that illustrate another stage in the example process for forming semiconductor devices that have an elongated contact formed over a source or drain region, in accordance with some embodiments of the present disclosure.
Figure 4B:
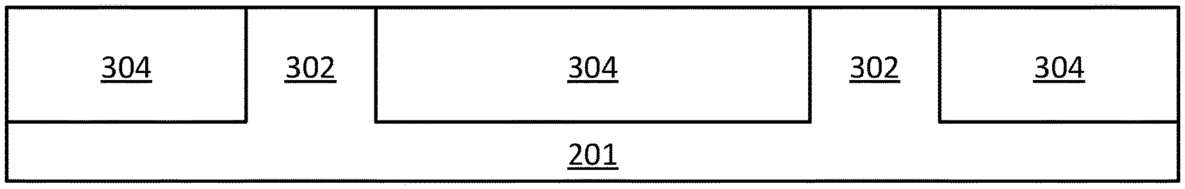

FIGS. 4A and 4B depict the cross-section views of the structure shown in FIGS. 3A and 3B, respectively, following the formation of a sacrificial gate 402 extending across the fins in a second direction different from the first direction, according to some embodiments. Sacrificial gate 402 may extend across the fins in a second direction that is orthogonal to the first direction. According to some embodiments, the sacrificial gate material is formed in parallel strips across the integrated circuit and removed in all areas not protected by a gate masking layer. Sacrificial gate 402 may be any suitable material that can be selectively removed without damaging the semiconductor material of the fins. In some examples, sacrificial gate 402 includes polysilicon.

As seen in the cross-section views, sacrificial gate 402 extends across the fins along the gate trench cross-section of FIG. 4A but is not present along the source/drain trench cross-section of FIG. 4B. Accordingly, sacrificial gate 402 (along with any gate spacers formed on the sidewalls of sacrificial gate 402) protect the underlying portions of the fins while the exposed portions of the fins are etched away as seen in FIG. 4B. According to some embodiments, both semiconductor layers 204 and sacrificial layers 202 are etched at substantially the same rate using an anisotropic RIE process. As observed in FIG. 4B, the fins are completely removed above subfin regions 302. In some embodiments, the RIE process may also etch into subfin regions 302 thus recessing subfin regions 302 beneath a top surface of dielectric fill 304.

Figure 5A:
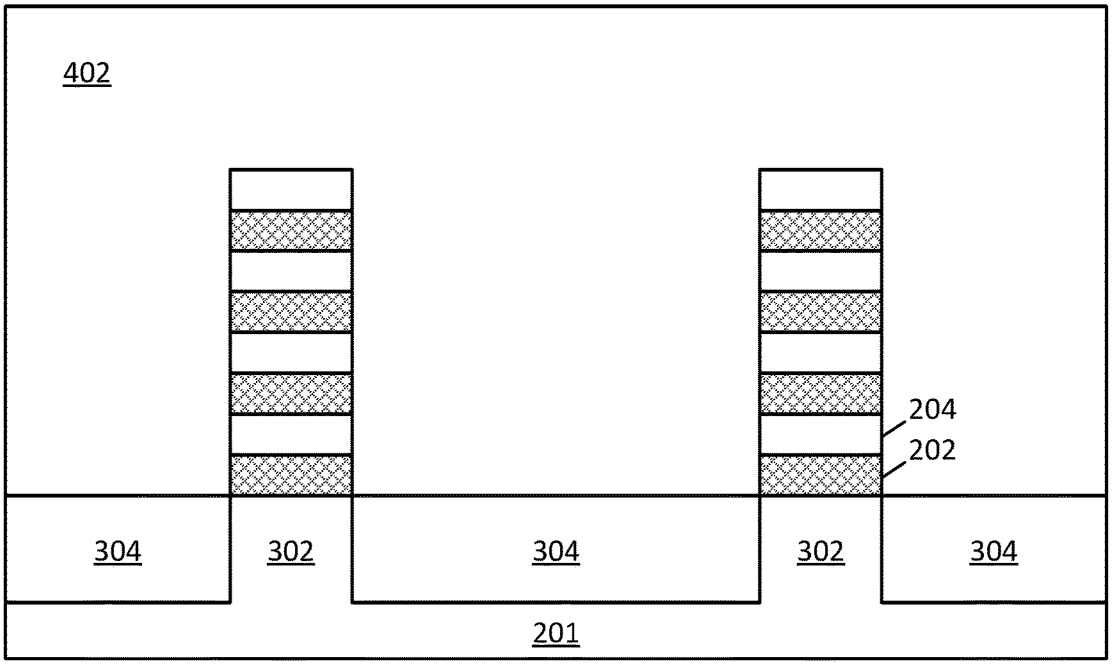
FIGS. 5A and 5B are cross-sectional views that illustrate another stage in the example process for forming semiconductor devices that have an elongated contact formed over a source or drain region, in accordance with some embodiments of the present disclosure.
Figure 5B:
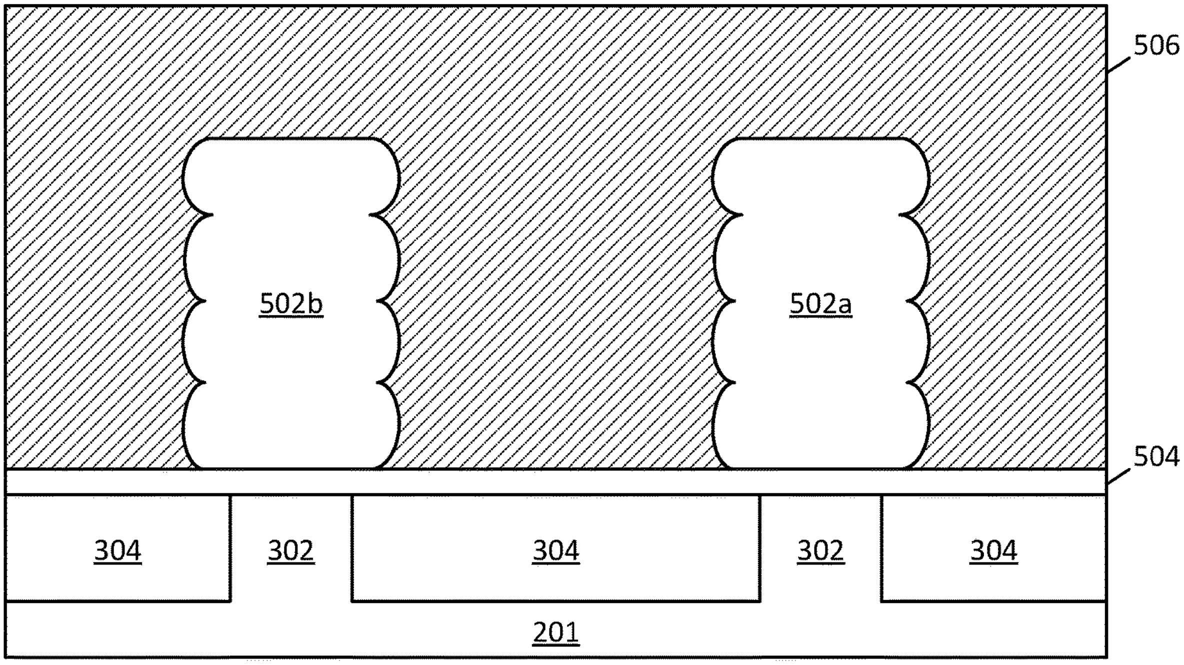

FIGS. 5A and 5B depict the cross-section views of the structure shown in FIGS. 4A and 4B, respectively, following the formation of source or drain regions 502*a*/502*b* at the ends of each of the fins (extending into and out of the page in FIG. 5A), according to some embodiments. Source or drain regions 502*a*/502*b* may be epitaxially grown from the exposed ends of semiconductor layers 204, such that the material grows together or otherwise merges towards the middle of the trenches between fins, according to some embodiments. Note that epitaxial growth on one semiconductor layer 204 can fully or partially merge with epitaxial growth on one or more other semiconductor layers 204 in the same vertical stack. The degree of any such merging can vary from one embodiment to the next. In the example of a PMOS device, a given source or drain region may be a semiconductor material (e.g., group IV or group III-V semiconductor materials) having a higher dopant concentration of p-type dopants compared to n-type dopants. In the example of an NMOS device, a given source or drain region may be a semiconductor material (e.g., group IV or group III-V semiconductor materials) having a higher dopant concentration of n-type dopants compared to p-type dopants. According to some embodiments, source or drain regions 502*a*/502*b* grown from different semiconductor devices may be aligned along the source/drain trench in the second direction as shown in FIG. 5B.

According to some embodiments, a bottom dielectric layer 504 may be deposited prior to the formation of source or drain regions 502*a*/502*b*. Bottom dielectric layer 504 may be any suitable dielectric material, such as silicon dioxide, silicon nitride, or silicon oxynitride. Bottom dielectric layer 504 may be included to provide isolation between source or drain regions 502*a*/502*b* and subfin regions 302.

According to some embodiments, another dielectric fill 506 is provided along the source/drain trench. Dielectric fill 506 may extend between adjacent ones of the source or drain regions 502*a*/502*b* along the second direction and also may extend up and over each of the source or drain regions 502*a*/502*b*, according to some embodiments. Accordingly, each source or drain region may be isolated from any adjacent source or drain regions by dielectric fill 506. Dielectric fill 506 may be any suitable dielectric material, although in some embodiments, dielectric fill 506 includes the same dielectric material as dielectric fill 304 or bottom dielectric layer 504. In one example, each of dielectric fill 506, bottom dielectric layer 504, and dielectric fill 304 includes silicon dioxide. Dielectric fill 506 may not be present between certain adjacent source or drain regions in situations where the adjacent source or drain regions are desired to be electrically coupled together. According to some embodiments, a top surface of dielectric fill 506 may be polished using, for example, chemical mechanical polishing (CMP). The top surface of dielectric fill 506 may be polished until it is substantially coplanar with a top surface of sacrificial gate 402. In some embodiments, inner gate spacers can be formed after the source/drain trenches are etched and before the epitaxial growth is performed. For instance, a selective etch can be used to laterally recess sacrificial layers 202, and that recess can then be filled with inner gate spacer material (e.g., silicon nitride or silicon oxynitride). Any excess gate spacer material can be removed with directional etching.

Figure 6A:
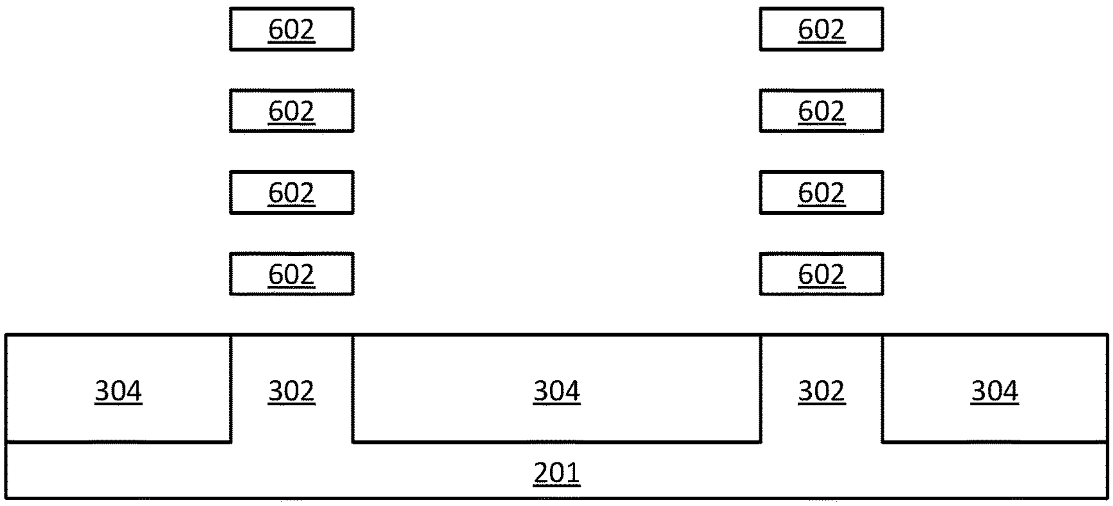
FIGS. 6A and 6B are cross-sectional views that illustrate another stage in the example process for forming semiconductor devices that have an elongated contact formed over a source or drain region, in accordance with some embodiments of the present disclosure.
Figure 6B:
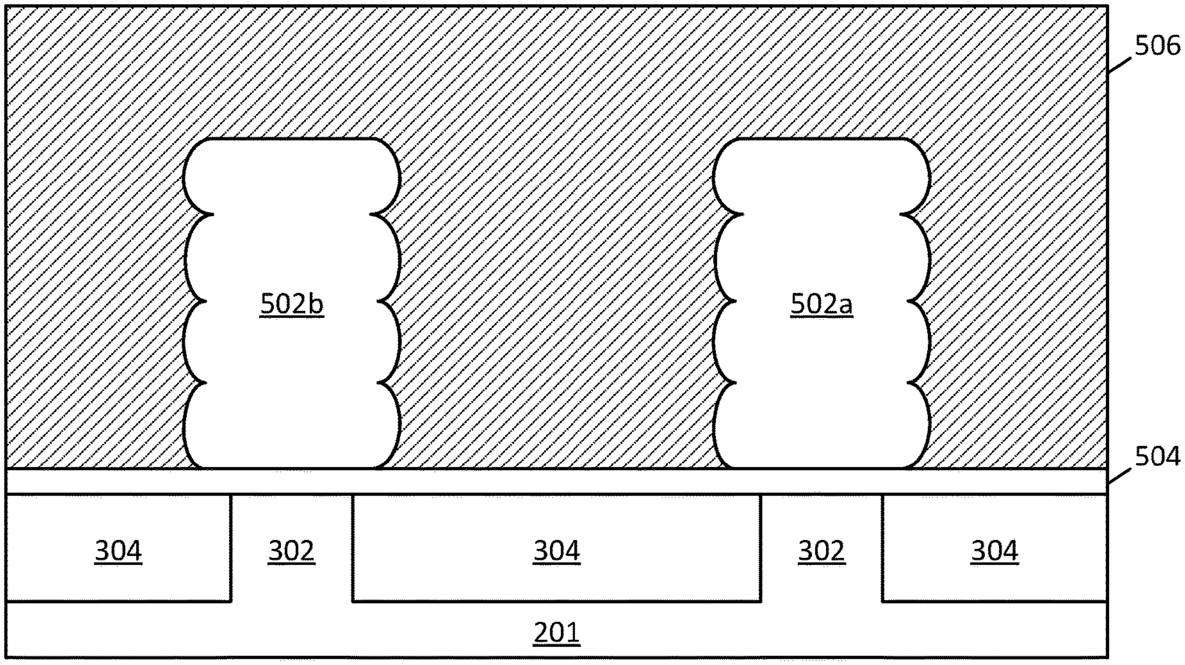

FIGS. 6A and 6B depict the cross-section views of the structure shown in FIGS. 5A and 5B, respectively, following the formation of nanoribbons 602 from semiconductor layers 204, according to some embodiments. Depending on the dimensions of the structures, nanoribbons 602 may also be considered nanowires or nanosheets. Sacrificial gate 402 may be removed using any wet or dry isotropic process thus exposing the alternating layer stack of the fins within the trenches left behind after the removal of sacrificial gate 402. Once sacrificial gate 402 is removed, sacrificial layers 202 may also be removed using a selective isotropic etching process that removes the material of sacrificial layers 202 but does not remove (or removes very little of) semiconductor layers 204 or any other exposed layers (e.g., inner gate spacers). At this point, the suspended (sometimes called released) semiconductor layers 204 form nanoribbons 602 that extend in the first direction (into and out of the page) between corresponding source or drain regions 502*a*/502*b* and other source or drain regions on the opposite ends of nanoribbons 602.

Figure 7A:
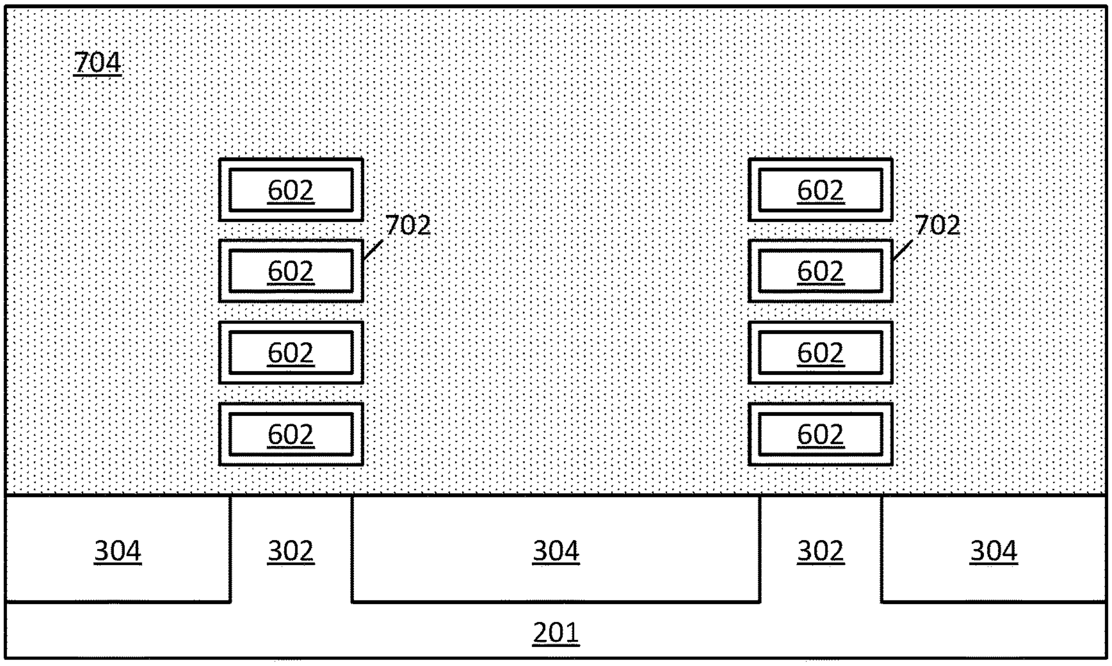
FIGS. 7A and 7B are cross-sectional views that illustrate another stage in the example process for forming semiconductor devices that have an elongated contact formed over a source or drain region, in accordance with some embodiments of the present disclosure.
Figure 7B:
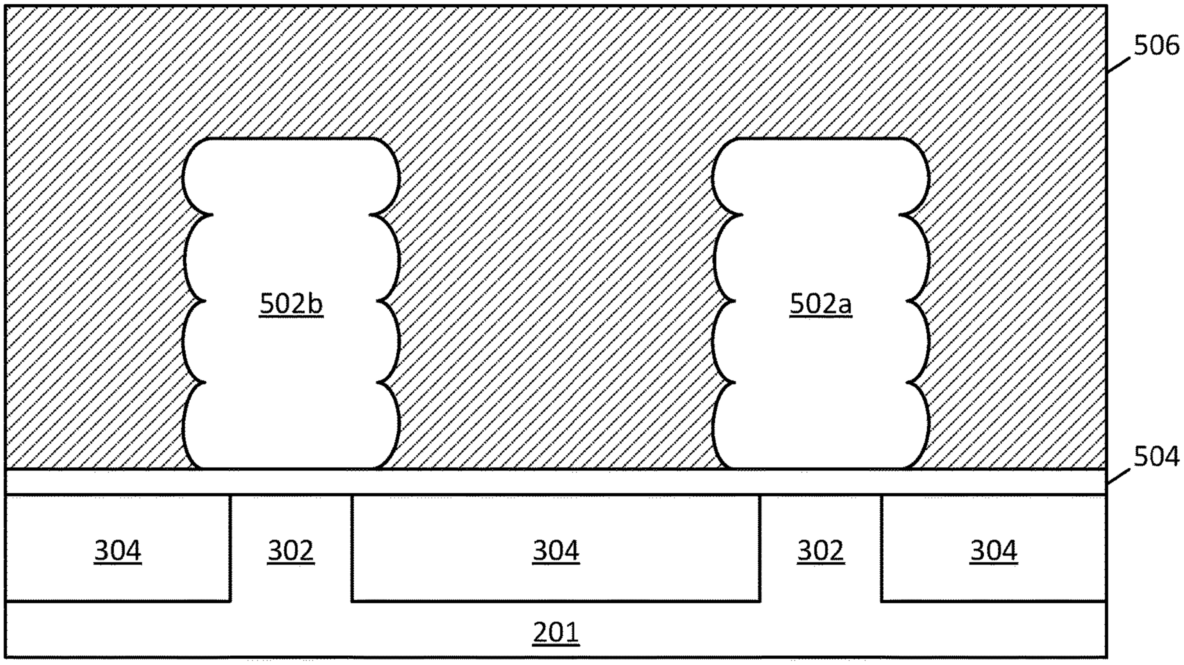

FIGS. 7A and 7B depict the cross-section views of the structure shown in FIGS. 6A and 6B, respectively, following the formation of a gate structure around nanoribbons 602 within the gate trench, according to some embodiments. As noted above, the gate structure includes a gate dielectric 702 and a gate electrode 704. Gate dielectric 702 may be conformally deposited around nanoribbons 602 using any suitable deposition process, such as atomic layer deposition (ALD). Gate dielectric 702 may include any suitable dielectric (such as silicon dioxide, and/or a high-k dielectric material). Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. According to some embodiments, gate dielectric 702 is hafnium oxide with a thickness between about 1 nm and about 5 nm. In some embodiments, gate dielectric 702 may include one or more silicates (e.g., titanium silicate, tungsten silicate, niobium silicate, and silicates of other transition metals). Gate dielectric 702 may be a multilayer structure, in some examples. For instance, gate dielectric 702 may include a first layer on nanoribbons 602, and a second layer on the first layer. The first layer can be, for instance, an oxide of the semiconductor layers (e.g., silicon dioxide) and the second layer can be a high-k dielectric material (e.g., hafnium oxide). In some embodiments, an annealing process may be carried out on gate dielectric 702 to improve its quality when a high-k dielectric material is used. In some embodiments, the high-k material can be nitridized to improve its aging resistance.

Gate electrode 704 may be deposited over gate dielectric 702 and can be any conductive structure. In some embodiments, gate electrode 704 includes doped polysilicon, a metal, or a metal alloy. Example suitable metals or metal alloys include aluminum, tungsten, cobalt, molybdenum, ruthenium, titanium, tantalum, copper, and carbides and nitrides thereof. Gate electrode 704 may include, for instance, one or more workfunction layers, resistance-reducing layers, and/or barrier layers. The workfunction layers can include, for example, p-type workfunction materials (e.g., titanium nitride) for PMOS gates, or n-type workfunction materials (e.g., titanium aluminum carbide) for NMOS gates.

Figure 8A:
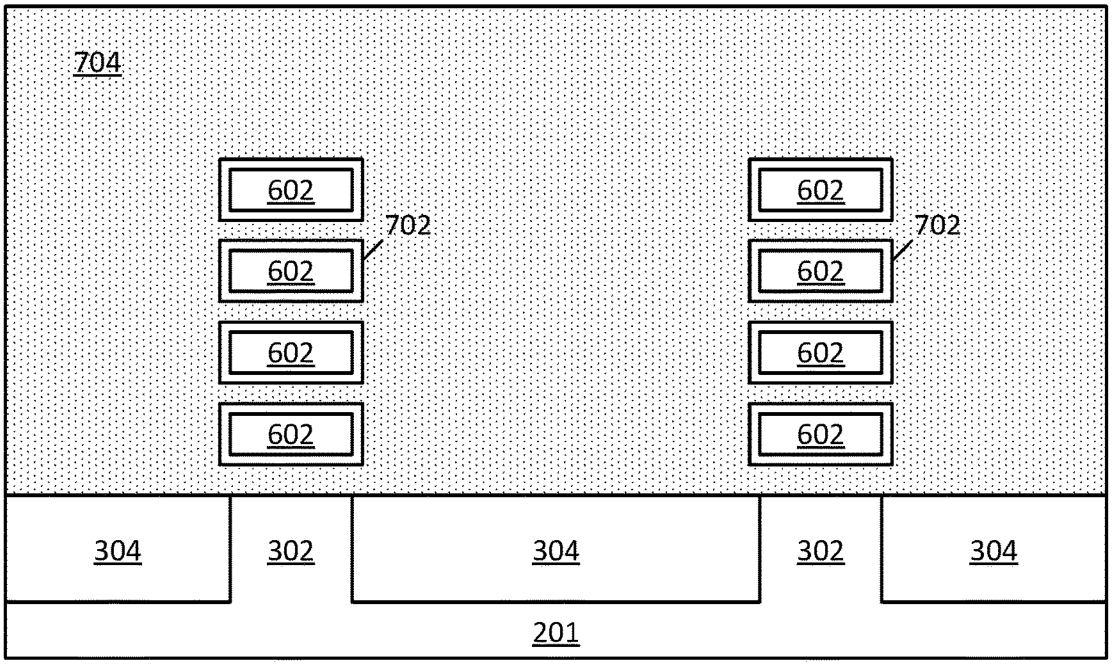
FIGS. 8A and 8B are cross-sectional views that illustrate another stage in the example process for forming semiconductor devices that have an elongated contact formed over a source or drain region, in accordance with some embodiments of the present disclosure.
Figure 8B:
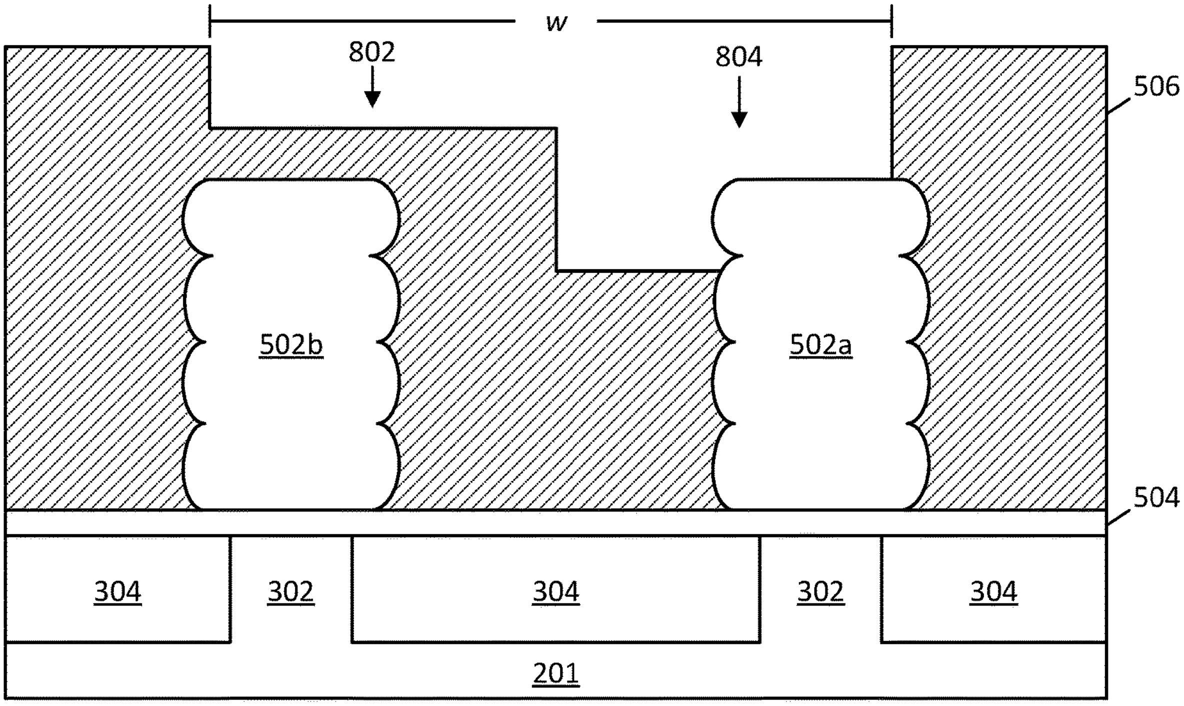

FIGS. 8A and 8B depict the cross-section views of the structure shown in FIGS. 7A and 7B, respectively, following the formation of a first recess 802 and a second recess 804 through dielectric fill 506 and exposing a portion of source or drain region 502*a*, according to some embodiments. Dielectric fill 506 may be recessed, for example, using an anisotropic etching process. According to some embodiments, first recess 802 is shallower than second recess 804 and extends away from second recess 804. In some examples, second recess 804 is formed over source or drain region 502*a* such that it exposes a portion of source or drain region 502*a*, and first recess 802 is formed over source or drain region 502*b* but does not expose any portion of source or drain region 502*b*. As described above, second recess 804 may continue along one or more sides of source or drain region 502*a* beneath the top surface of source or drain region 502*a*. In some embodiments, a dielectric cap layer (e.g., silicon nitride) may be present around source or drain region 502*a* to protect it during the etching process. The exposed dielectric cap layer may be removed following the formation of first recess 802 and second recess 804.

According to some embodiments, first recess 802 may be formed first and may extend across the entire width w of the opening. Second recess 804 may then be formed by first patterning a blocking mask over source or drain region 502*b* and then further etching a portion of second recess 804 to expose the underlying source or drain region 502*a*. The mask (e.g., oxide or CHM, or other suitable masking material) can then be removed. In another example, a blocking mask is patterned over source or drain region 502*b* and second recess 804 is partially formed (e.g., etching through half of the depth of second recess 804), followed by removal of the mask (e.g., oxide or CHM, or other suitable masking material) and a second etching process across the entire width w of the opening to simultaneously form first recess 802 and finish forming the remainder of second recess 804. In yet another example, dielectric 506 includes a first dielectric (e.g., silicon dioxide) over source or drain region 502*b*, and a second dielectric (e.g., silicon nitride) over source or drain region 502*a*. The first and second dielectrics can be deposited, for instance, after epitaxial growth of the underlying source or drain region. In any such case, given the composition diversity of the first and second dielectrics, one of the dielectrics can be selectively etched with respect to the other, thus allowing formation of an elongated contact trench as shown in FIG. 8B. More generally, any selective deposition and/or selective etching schemes can be used to provision an elongated contact trench having a first recess 802 of a first height, and a second recess 804 of a second height greater than the first height.

Figure 9A:
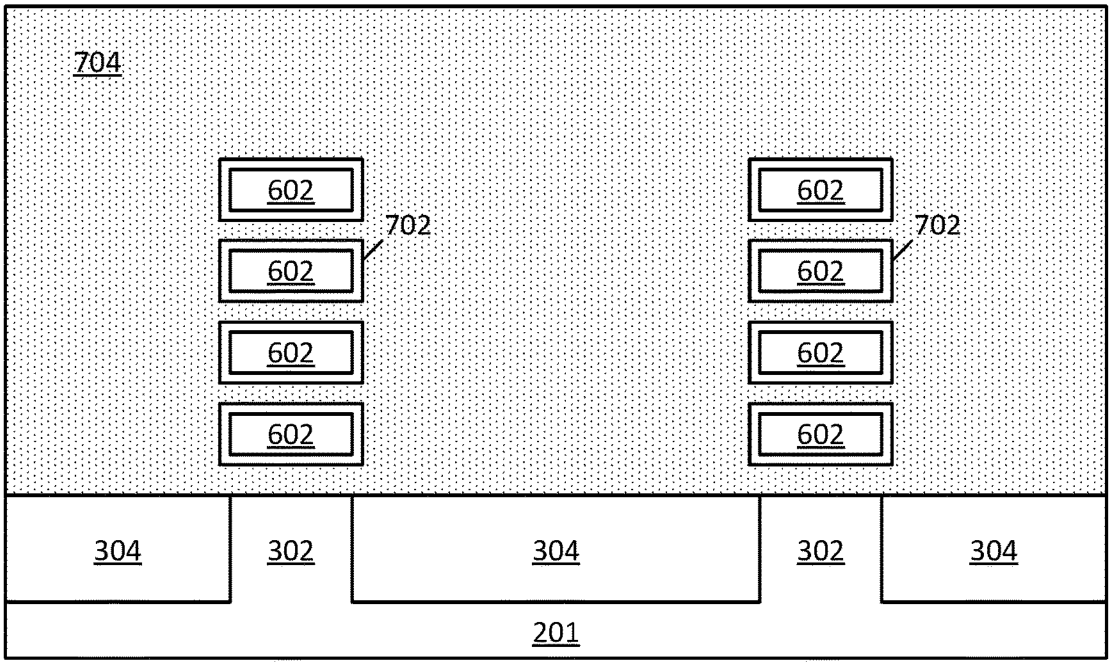
FIGS. 9A and 9B are cross-sectional views that illustrate another stage in the example process for forming semiconductor devices that have an elongated contact formed over a source or drain region, in accordance with some embodiments of the present disclosure.
Figure 9B:
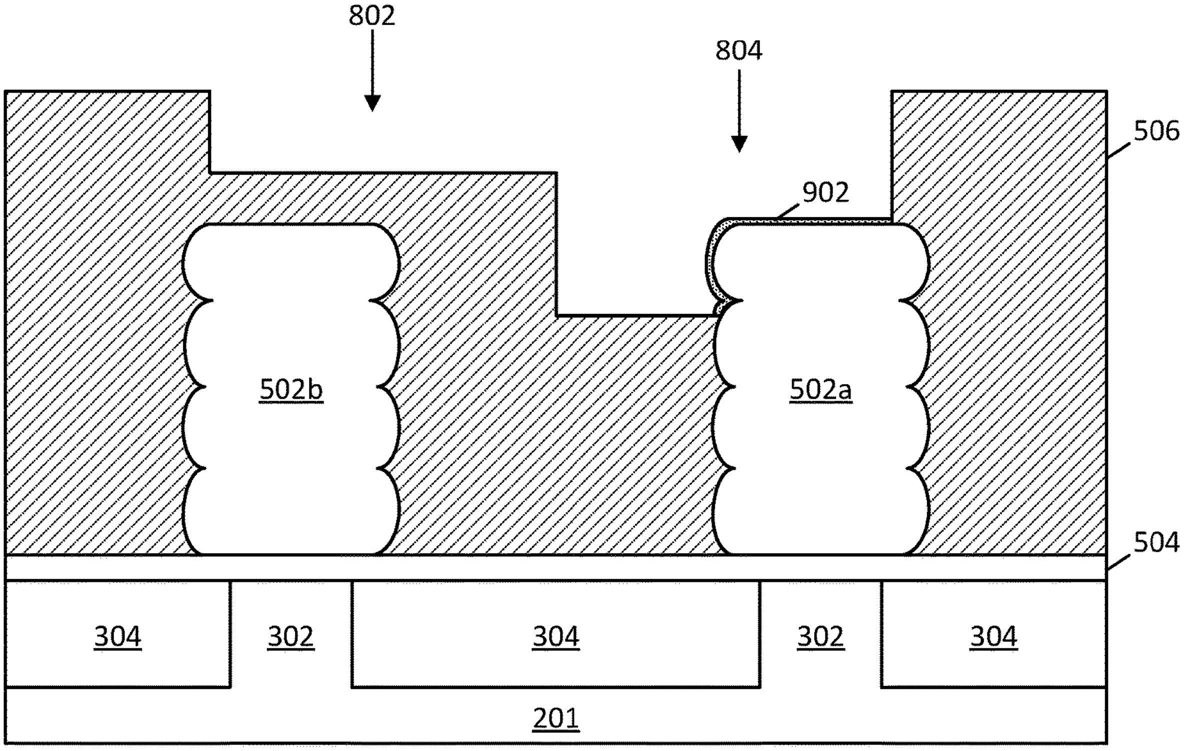

FIGS. 9A and 9B depict the cross-section views of the structure shown in FIGS. 8A and 8B, respectively, following the formation of a conductive layer 902 on the exposed surface of source or drain region 502*a* within second recess 804, according to some embodiments. Conductive layer 902 may be a silicide layer used to lower the contact resistance of source or drain region 502*a*. In some embodiments, conductive layer 902 extends around all exposed outer surfaces of source or drain region 502*a*. Conductive layer 902 may be epitaxially grown such that it grows only on the exposed semiconductor surfaces of source or drain region 502*a*. According to some embodiments, conductive layer 902 may include one or more of titanium silicide (TiSi), nickel silicide (NiSi), nickel platinum silicide (NiPtSi), or cobalt silicide (CoSi), to name a few examples. In other examples, a source or drain region with a relatively high concentration of germanium (e.g., 50-100 atomic %) may cause conductive layer 902 to be a germanide of the example metals/alloys given. More generally, conductive layer 902 may be any material that provides a suitable contact-reducing layer.

Figure 10A:
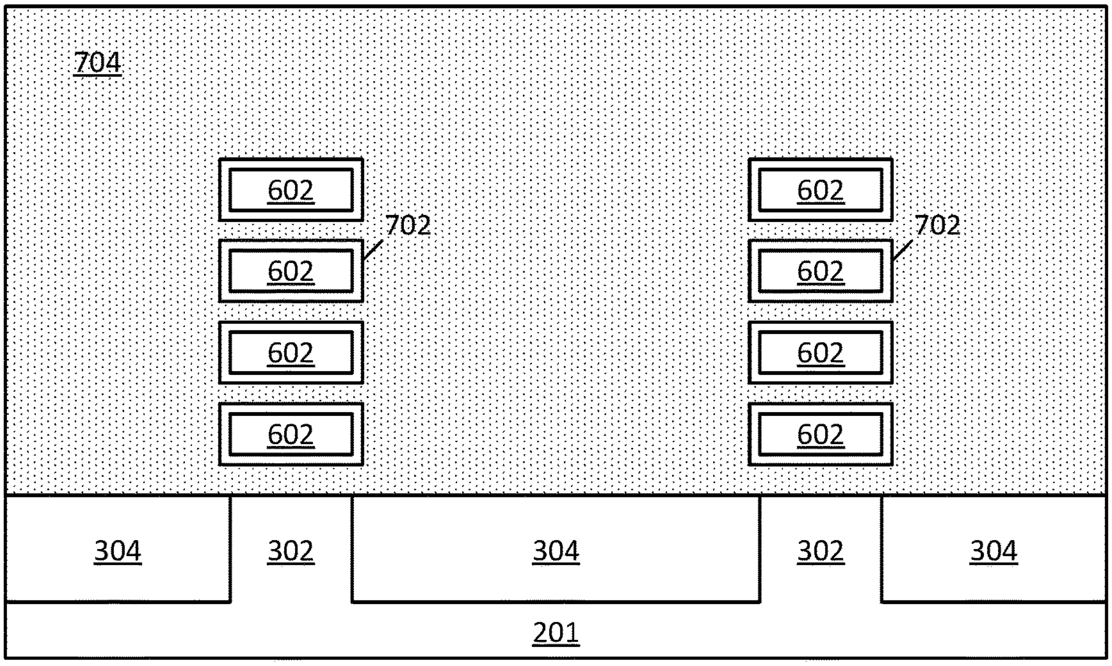
FIGS. 10A and 10B are cross-sectional views that illustrate another stage in the example process for forming semiconductor devices that have an elongated contact formed over a source or drain region, in accordance with some embodiments of the present disclosure.
Figure 10B:
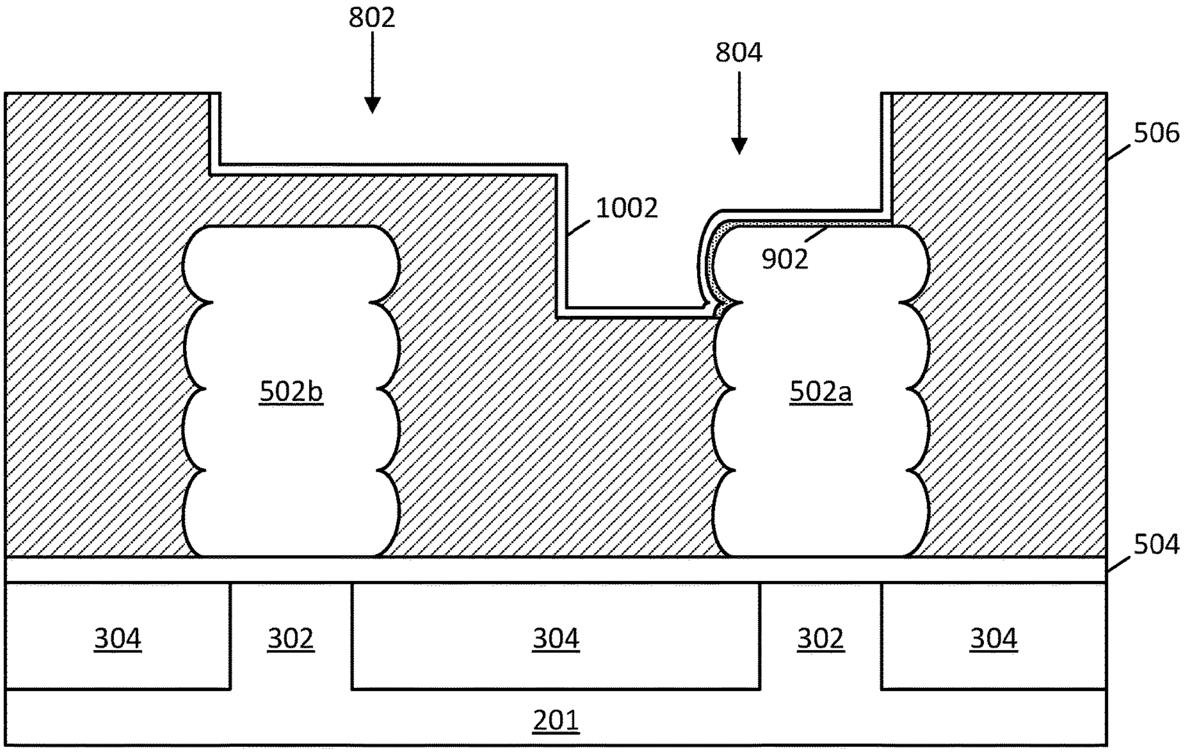

FIGS. 10A and 10B depict the cross-section views of the structure shown in FIGS. 9A and 9B, respectively, following the formation of a conformal conductive liner 1002 along all exposed surfaces within first recess 802 and second recess

804, according to some embodiments. Conductive liner 1002 may be formed directly on dielectric fill 506 and conductive layer 902, using ALD or CVD. According to some embodiments, conductive liner 1002 includes any suitable conductive material, such as titanium or tantalum to name a few examples. Conductive liner 1002 may have a thickness between about 1 nm and about 3 nm, according to some such embodiments.

Figure 11A:
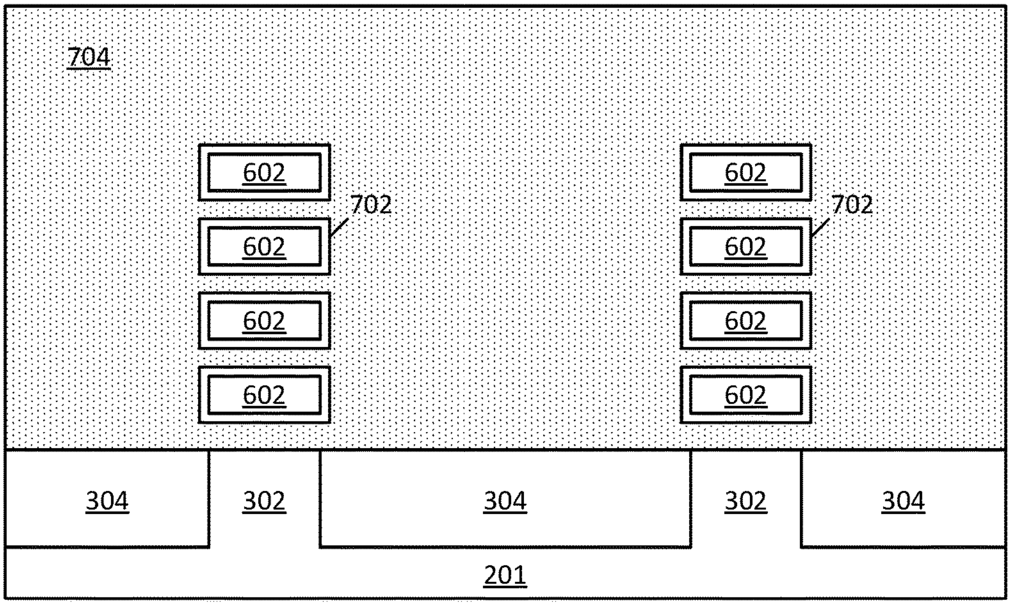
FIGS. 11A and 11B are cross-sectional views that illustrate another stage in the example process for forming semiconductor devices that have an elongated contact formed over a source or drain region, in accordance with some embodiments of the present disclosure.
Figure 11B:
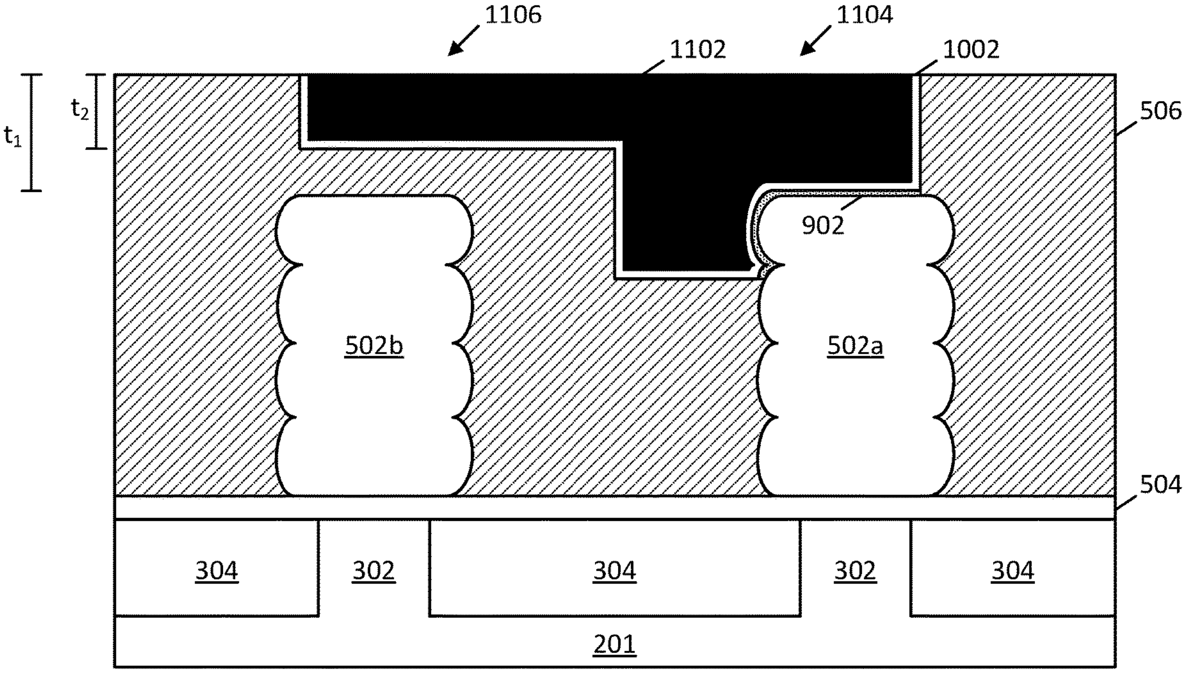

FIGS. 11A and 11B depict the cross-section views of the structure shown in FIGS. 10A and 10B, respectively, following the formation of a conductive fill 1102 within recesses 802 and 804 to complete the formation of a conductive contact having a first section 1104 and a second section 1106, according to some embodiments. First section 1104 of the conductive contact is on or over source or drain region 502*a* while second section 1106 of the conductive contact extends away from first section 1104 and over source or drain region 502*b*. Conductive fill 1102 may be any suitably conductive material such as tungsten (W). Other conductive materials may include copper (Cu), ruthenium (Ru), cobalt (Co), titanium (Ti), molybdenum (Mo), or any alloys thereof. According to some embodiments, a top surface of conductive fill 1102 of both first section 1104 and second section 1106 is polished using, for example, chemical mechanical polishing (CMP) until it is substantially coplanar with a top surface of dielectric fill 506.

According to some embodiments, first section 1104 of the conductive contact has a first thickness $t_1$ above source or drain region 502*a* and second section 1106 of the conductive contact extending away from first section 1104 has a second thickness $t_2$. In some examples, the first thickness $t_1$ is between about 10 nm to about 100 nm (e.g., about 30 nm and about 40 nm), and the second thickness $t_2$ is between about 5 nm to about 50 (e.g., 10 nm and about 20 nm). More generally, the first thickness $t_1$ may be about 5 nm greater than the second thickness $t_2$, or at least two times greater than the second thickness $t_2$. Due to its smaller thickness, second section 1106 of the conductive contact may extend above adjacent source or drain region 502*b* without contacting it. The conductive fill 1102 of the first and second sections 1104 and 1106 may be a continuous and monolithic body of conductive fill material, such that there are no seams or grain boundaries between the first and second sections 1104 and 1106. Similarly, the conductive liner 1002 may run continuously along the first and second sections 1104 and 1106.

Figure 12A:
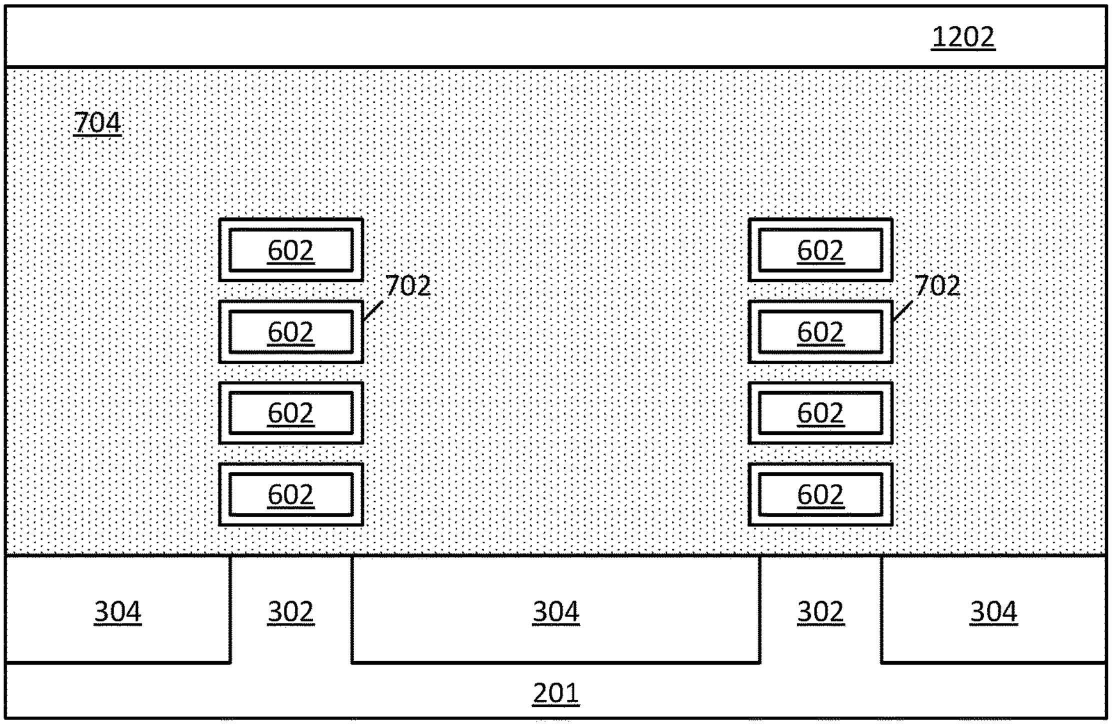
FIGS. 12A and 12B are cross-sectional views that illustrate another stage in the example process for forming semiconductor devices that have an elongated contact formed over a source or drain region, in accordance with some embodiments of the present disclosure.
Figure 12B:
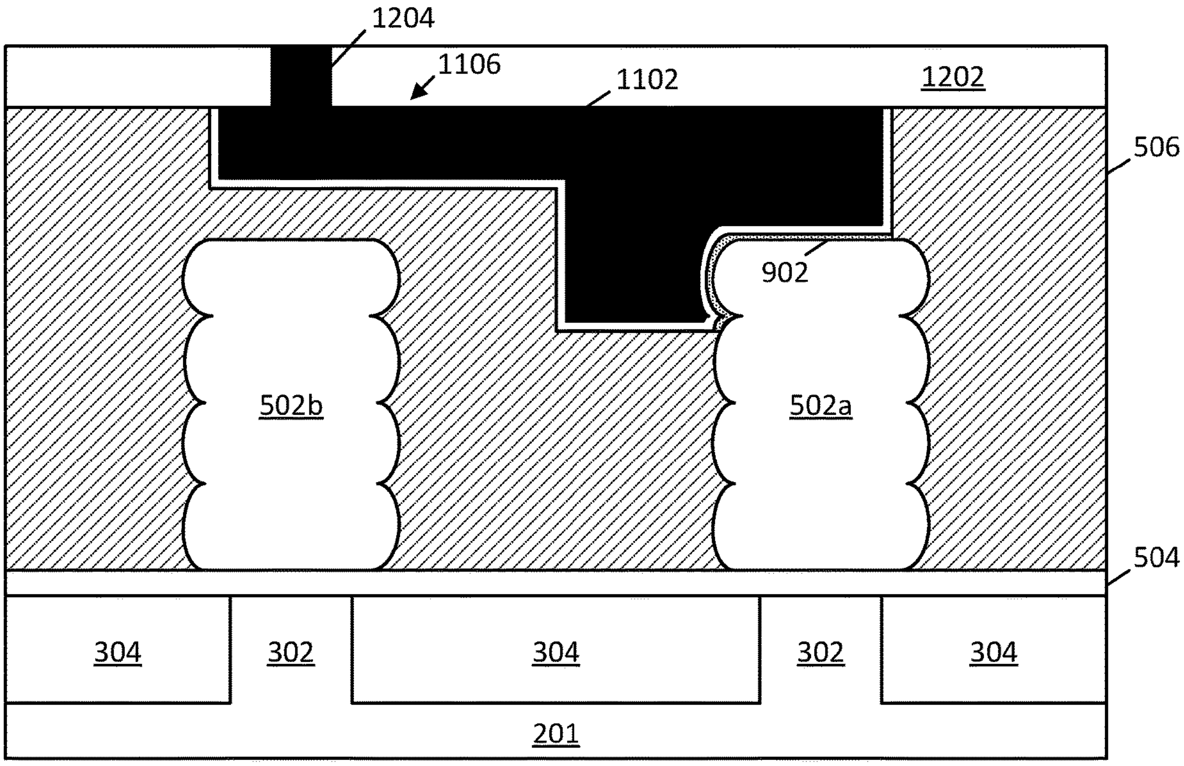

FIGS. 12A and 12B depict the cross-section views of the structure shown in FIGS. 11A and 11B, respectively, following the formation of an interconnect layer over the structure, according to some embodiments. The interconnect layer may be a first interconnect layer of an interconnect structure that includes any number of stacked interconnect layers, with each interconnect layer including any number and arrangement of conductive vias and conductive traces. According to an embodiment, the illustrated interconnect layer includes a dielectric layer 1202 and a conductive via 1204 through dielectric layer 1202.

Dielectric layer 1202 may be any suitable dielectric material, such as silicon dioxide. Conductive via 1204 may include the same conductive material as conductive fill 1102 and/or any of the conductive materials listed for conductive fill 1102. In one example, conductive via 1204 includes tungsten. According to some embodiments, conductive via 1204 contacts second section 1106 of the conductive contact, such that conductive via 1204 is not located directly over source or drain region 502*a*. Accordingly, the conductive contact may be used to route signal or power between source or drain region 502*a* and conductive via 1204 where conductive via 1204 is not located directly above source or drain region 502*a*. In some examples, conductive via 1204 may be located directly above another semiconductor structure (such as source or drain region 502*b*) or directly above no semiconductor structures.

Figure 13:
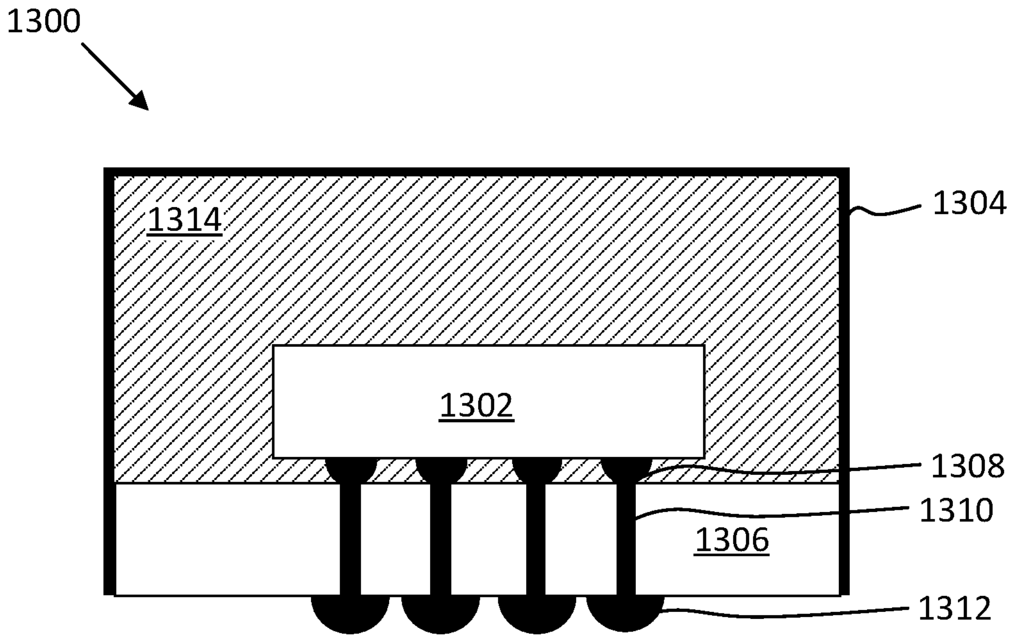
FIG. 13 illustrates a cross-sectional view of a chip package containing one or more semiconductor dies, in accordance with some embodiments of the present disclosure.

FIG. 13 illustrates an example embodiment of a chip package 1300, in accordance with an embodiment of the present disclosure. As can be seen, chip package 1300 includes one or more dies 1302. One or more dies 1302 may include at least one integrated circuit having semiconductor devices, such as any of the semiconductor devices disclosed herein. One or more dies 1302 may include any other circuitry used to interface with other devices formed on the dies, or other devices connected to chip package 1300, in some example configurations.

As can be further seen, chip package 1300 includes a housing 1304 that is bonded to a package substrate 1306. The housing 1304 may be any housing, and may provide, for example, electromagnetic shielding and environmental protection for the components of chip package 1300. The one or more dies 1302 may be conductively coupled to a package substrate 1306 using connections 1308, which may be implemented with any number of connection mechanisms, such as solder bumps, ball grid array (BGA), pins, or wire bonds, to name a few examples. Package substrate 1306 may be any package substrate, but in some cases includes a dielectric material having conductive pathways (e.g., including conductive vias and lines) extending through the dielectric material between the faces of package substrate 1306, or between different locations on each face. In some embodiments, package substrate 1306 may have a thickness less than 1 millimeter (e.g., between 0.1 millimeters and 0.5 millimeters), although any number of package geometries can be used. Additional conductive contacts 1312 may be disposed at an opposite face of package substrate 1306 for conductively contacting, for instance, a printed circuit board (PCB). One or more vias 1310 extend through a thickness of package substrate 1306 to provide conductive pathways between one or more of connections 1308 to one or more of contacts 1312. Vias 1310 are illustrated as single straight columns through package substrate 1306 for ease of illustration, although other configurations can be used (e.g., damascene, dual damascene, through-silicon via, or an interconnect structure that meanders through the thickness of substrate 1306 to contact one or more intermediate locations therein). In still other embodiments, vias 1310 are fabricated by multiple smaller stacked vias, or are staggered at different locations across package substrate 1306. In the illustrated embodiment, contacts 1312 are solder balls (e.g., for bump-based connections or a ball grid array arrangement), but any suitable package bonding mechanism may be used (e.g., pins in a pin grid array arrangement or lands in a land grid array arrangement). In some embodiments, a solder resist is disposed between contacts 1312, to inhibit shorting.

In some embodiments, a mold material 1314 may be disposed around the one or more dies 1302 included within housing 1304 (e.g., between dies 1302 and package substrate 1306 as an underfill material, as well as between dies 1302 and housing 1304 as an overfill material). Although the dimensions and qualities of the mold material 1314 can vary from one embodiment to the next, in some embodiments, a thickness of mold material 1314 is less than 1 millimeter. Example materials that may be used for mold material 1314 include epoxy mold materials, as suitable. In some cases, the mold material 1314 is thermally conductive, in addition to being electrically insulating.

Methodology

Figure 14:
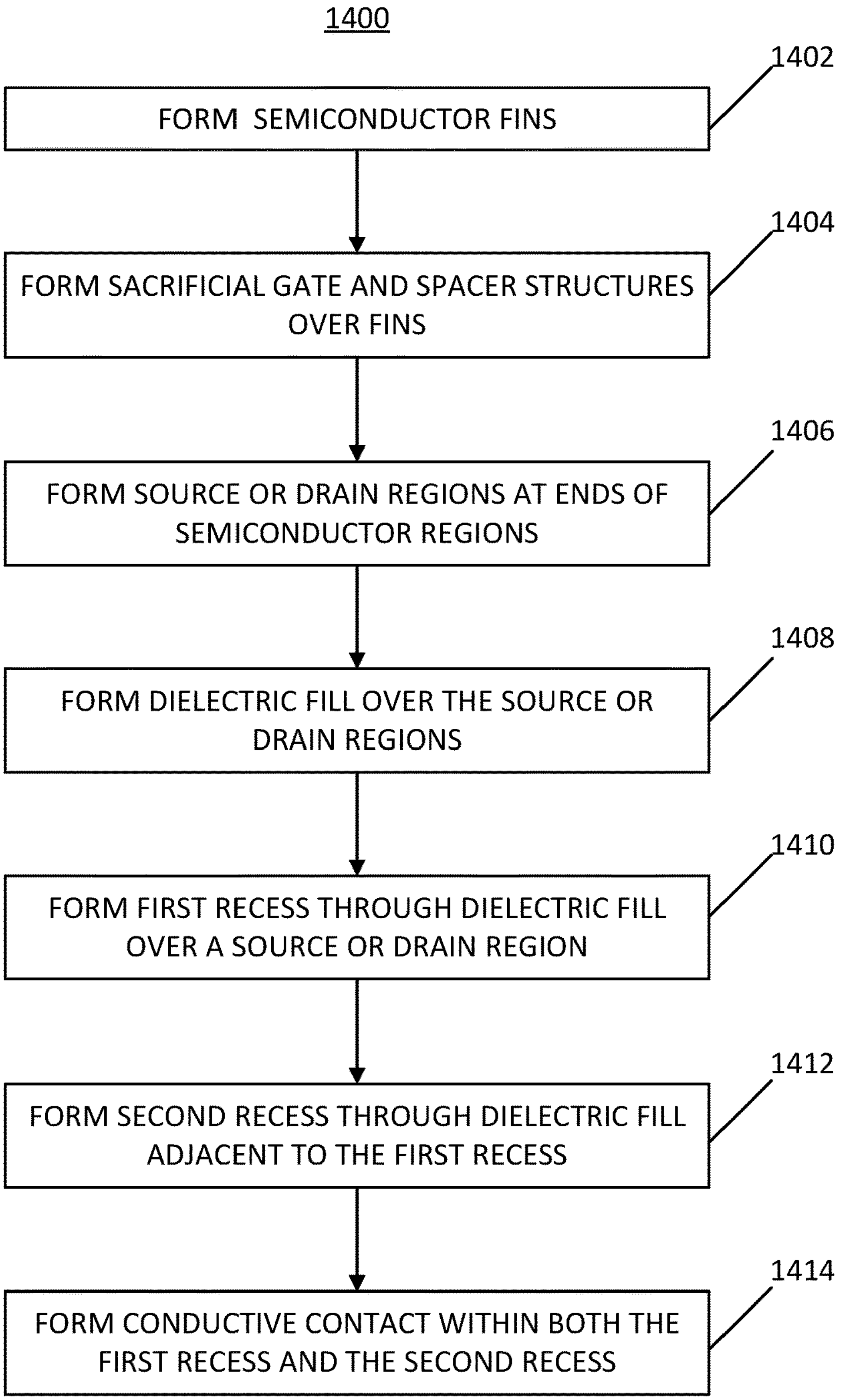
FIG. 14 is a flowchart of a fabrication process for semiconductor devices having an elongated contact formed over a source or drain region, in accordance with an embodiment of the present disclosure.

FIG. 14 is a flow chart of a method 1400 for forming at least a portion of an integrated circuit, according to an embodiment. Various operations of method 1400 may be illustrated in FIGS. 2A-12A and FIGS. 2B-12B. However, the correlation of the various operations of method 1400 to the specific components illustrated in the aforementioned figures is not intended to imply any structural and/or use limitations. Rather, the aforementioned figures provide one example embodiment of method 1400. Other operations may be performed before, during, or after any of the operations of method 1400. For example, method 1400 does not explicitly describe all processes that are performed to form common transistor structures. Some of the operations of method 1400 may be performed in a different order than the illustrated order.

Method 1400 begins with operation 1402 where any number of parallel semiconductor fins are formed, according to some embodiments. The semiconductor material in the fins may be formed from a substrate such that the fins are an integral part of the substrate (e.g., etched from a bulk silicon substrate). Alternatively, the fins can be formed of material deposited onto an underlying substrate. In one such example case, a blanket layer of silicon germanium (SiGe) can be deposited onto a silicon substrate, and then patterned and etched to form a plurality of SiGe fins extending from that substrate. In another such example, the fins include alternating layers of material (e.g., alternating layers of silicon and SiGe) that facilitates forming of nanowires and nanoribbons during a gate forming process where one type of the alternating layers are selectively etched away so as to liberate the other type of alternating layers within the channel region, so that a gate-all-around (GAA) process can then be carried out. The alternating layers can be blanket deposited and then etched into fins, or deposited into fin-shaped trenches. The fins may also include a cap structure over each fin that is used to define the locations of the fins during, for example, an RIE process. The cap structure may be a dielectric material, such as silicon nitride.

According to some embodiments, a dielectric layer is formed around subfin portions of the one or more fins. In some embodiments, the dielectric layer extends between each pair of adjacent parallel fins and runs lengthwise in the same direction as the fins. In some embodiments, the anisotropic etching process that forms the fins also etches into a portion of the substrate and the dielectric layer may be formed within the recessed portions of the substrate. Accordingly, the dielectric layer acts as shallow trench isolation (STI) between adjacent fins. The dielectric layer may be any suitable dielectric material, such as silicon dioxide.

Method 1400 continues with operation 1404 where a sacrificial gate and spacer structures are formed over the fins. The sacrificial gate may be patterned using a gate masking layer in a strip that runs orthogonally over the fins (many gate masking layers and corresponding sacrificial gates may be formed parallel to one another (e.g., forming a cross-hatch pattern with the fins). The gate masking layer may be any suitable hard mask material, such as CHM or silicon nitride. The sacrificial gate may be formed from any suitable material that can be selectively removed at a later time without damaging the semiconductor material of the fins. In one example, the sacrificial gate includes polysilicon. The spacer structures may be deposited and then etched back such that the spacer structures remain mostly only on sidewalls of any exposed structures. According to some embodiments, the spacer structures may be any suitable dielectric material, such as silicon nitride or silicon oxynitride.

Method 1400 continues with operation 1406 where source or drain regions are formed at the ends of the semiconductor regions of each of the fins. Any portions of the fins not protected by the sacrificial gate and spacer structures may be removed using, for example, an anisotropic etching process followed by the epitaxial growth of the source or drain regions from the exposed ends of the semiconductor layers in the fins. In some example embodiments, the source or drain regions are NMOS source or drain regions (e.g., epitaxial silicon) or PMOS source or drain regions (e.g., epitaxial SiGe).

Method 1400 continues with operation 1408 where a dielectric fill is formed over the source or drain regions. The dielectric fill may be formed adjacent to the various source or drain regions for additional electrical isolation between adjacent regions. The dielectric fill may also extend over a top surface of the source or drain regions. The dielectric fill can take up any remaining space along the source/drain trench, according to some embodiments. The dielectric fill may include any suitable dielectric material, such as silicon dioxide or silicon oxynitride. In some embodiments, a first dielectric fill is deposited over some source or drain regions, and a second dielectric fill that is elementally distinct from the first dielectric fill is deposited over other source or drain regions. Such a configuration may be used to allow for a subsequent selective etch scheme used to form a contact trench having a variable height.

Method 1400 continues with operation 1410 where a first recess is formed through the dielectric fill over a given source or drain region. The first recess may be formed using any suitable anisotropic etching process. According to some embodiments, the first recess exposes at least a top surface of the given source or drain region. In some examples, the first recess extends along one or more sides of the given source or drain region below the top surface of the given source or drain region. The first recess has a first depth between a top surface of the dielectric fill and a top surface of the source or drain region.

Method 1400 continues with operation 1412 where a second recess is formed through the dielectric fill and adjacent to the first recess. The second recess may be formed using any suitable anisotropic etching process. According to some embodiments, the second recess extends laterally away from the first recess (e.g., along the source/drain trench) and has a shallower depth compared to the first recess. According to some embodiments, the second recess has a second depth between a top surface of the dielectric fill and a bottom surface of the second recess that is less than the first depth. In some examples, the first depth is at least twice as large as the second depth. In other examples, the first depth is at least 5 nm deeper than the second depth. In still other embodiments, the first depth is about 10 nm to 20 nm deeper than the second depth. The second recess may be merged with the first recess to form a stepped recess made up of both the first and second recesses. The second recess may extend over an adjacent source or drain region without exposing any part of the adjacent source or drain region. Note that operations 1410 and 1412 may be performed in a different order or simultaneously, as described above with respect to the example of FIG. 8B.

Method 1400 continues with operation 1414 where a conductive contact is formed within both the first recess and the second recess to form an elongated conductive contact on the given source or drain region. The conductive contact may include a conductive liner along all exposed surfaces within the first and second recesses and a conductive fill on the conductive liner. The conductive liner may include any suitable conductive material, such as titanium or tantalum to name a few examples. The conductive liner may have a thickness, for example, between about 1 nm and about 3 nm. The conductive fill may be any suitably conductive material such as tungsten (W). Other conductive materials may include copper (Cu), ruthenium (Ru), cobalt (Co), titanium (Ti), molybdenum (Mo), or any alloys thereof. According to some embodiments, a top surface of the conductive fill is polished using, for example, CMP until it is substantially coplanar with a top surface of the dielectric fill within the source/drain trench.

The conductive contact has a first section within the first recess and second section within the second recess. Since the conductive contact fits the shape of the first and second recesses, the first section of the conductive contact above the given source or drain region has a first thickness and the second section of the conductive contact has a second thickness that is less than the first thickness. The second section of the conductive contact extends away from the first section of the conductive contact, such that the second section of the conductive contact may extend over an adjacent source or drain region without touching the adjacent source or drain region. A conductive via within an interconnect layer may be formed on the second section of the conductive contact, according to some embodiments.

Example System

Figure 15:
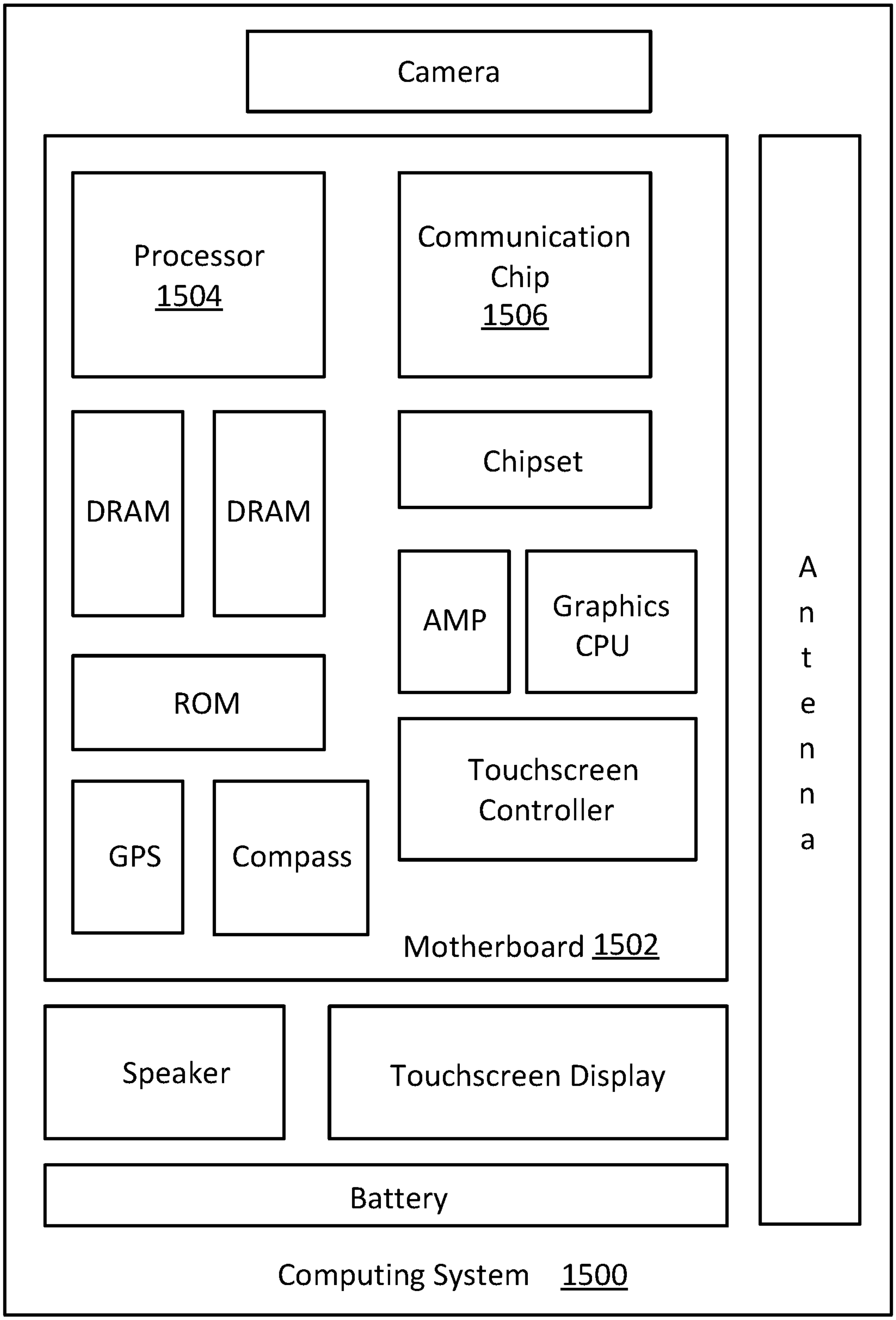
FIG. 15 illustrates a computing system including one or more integrated circuits, as variously described herein, in accordance with an embodiment of the present disclosure.

FIG. 15 is an example computing system implemented with one or more of the integrated circuit structures as disclosed herein, in accordance with some embodiments of the present disclosure. As can be seen, the computing system 1500 houses a motherboard 1502. The motherboard 1502 may include a number of components, including, but not limited to, a processor 1504 and at least one communication chip 1506, each of which can be physically and electrically coupled to the motherboard 1502, or otherwise integrated therein. As will be appreciated, the motherboard 1502 may be, for example, any printed circuit board (PCB), whether a main board, a daughterboard mounted on a main board, or the only board of system 1500, etc.

Depending on its applications, computing system 1500 may include one or more other components that may or may not be physically and electrically coupled to the motherboard 1502. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1500 may include one or more integrated circuit structures or devices configured in accordance with an example embodiment (e.g., a module including an integrated circuit on a substrate, the substrate having semiconductor devices that include an elongated conductive contact on a source or drain region). In some embodiments, multiple functions can be integrated into one or more chips (e.g., for instance, note that the communication chip 1506 can be part of or otherwise integrated into the processor 1504).

The communication chip 1506 enables wireless communications for the transfer of data to and from the computing system 1500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1506 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1500 may include a plurality of communication chips 1506. For instance, a first communication chip 1506 may be dedicated to shorter range wireless communications such as Wi-Fi and Bluetooth and a second communication chip 1506 may be dedicated to longer range wireless communications such as GPS, EDGE, GPRS, CDMA, WiMAX, LTE, Ev-DO, and others.

The processor 1504 of the computing system 1500 includes an integrated circuit die packaged within the processor 1504. In some embodiments, the integrated circuit die of the processor includes onboard circuitry that is implemented with one or more semiconductor devices as variously described herein. The term "processor" may refer to any device or portion of a device that processes, for instance, electronic data from registers and/or memory to transform that electronic data into other electronic data that may be stored in registers and/or memory.

The communication chip 1506 also may include an integrated circuit die packaged within the communication chip 1506. In accordance with some such example embodiments, the integrated circuit die of the communication chip includes one or more semiconductor devices as variously described herein. As will be appreciated in light of this disclosure, note that multi-standard wireless capability may be integrated directly into the processor 1504 (e.g., where functionality of any chips 1506 is integrated into processor 1504, rather than having separate communication chips). Further note that processor 1504 may be a chip set having such wireless capability. In short, any number of processor 1504 and/or communication chips 1506 can be used. Likewise, any one chip or chip set can have multiple functions integrated therein.

In various implementations, the computing system 1500 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

It will be appreciated that in some embodiments, the various components of the computing system 1500 may be combined or integrated in a system-on-a-chip (SoC) architecture. In some embodiments, the components may be hardware components, firmware components, software components or any suitable combination of hardware, firmware or software.

FURTHER EXAMPLE EMBODIMENTS

The following examples pertain to further embodiments, from which numerous permutations and configurations will be apparent.

Example 1 is an integrated circuit that includes a semiconductor device having a semiconductor region extending in a first direction from a source or drain region, and a gate structure extending in a second direction over the semiconductor region, and a conductive contact on at least a top surface of the source or drain region. The conductive contact has a first section directly above the source or drain region and a second section extending away from the source or drain region such that the source or drain region is not below the second section. The first section has a first thickness and the second section has a second thickness with the first thickness being greater than the second thickness by 5 nm or more.

Example 2 includes the integrated circuit of Example 1, wherein the semiconductor region comprises a plurality of semiconductor nanoribbons.

Example 3 includes the integrated circuit of Example 2, wherein the plurality of semiconductor nanoribbons comprise germanium, silicon, or a combination thereof.

Example 4 includes the integrated circuit of any one of Examples 1-3, wherein a top surface of the first section of the conductive contact is substantially coplanar with a top surface of the second section of the conductive contact, and a bottom surface of the first section of the conductive contact is not coplanar with a bottom surface of the second section of the conductive contact due to the first thickness being greater than the second thickness.

Example 5 includes the integrated circuit of any one of Examples 1-4, wherein the source or drain region is a first source or drain region and the second section of the conductive contact extends over a second source or drain region of an adjacent semiconductor device.

Example 6 includes the integrated circuit of Example 5, wherein the first source or drain region has a different dopant type (n or p) than the second source or drain region.

Example 7 includes the integrated circuit of any one of Examples 1-6, further comprising a conductive via that contacts a top surface of the second section of the conductive contact.

Example 8 includes the integrated circuit of any one of Examples 1-7, wherein both the first and second sections of the conductive contact comprise a continuous conductive liner and a continuous and monolithic body of conductive fill.

Example 9 includes the integrated circuit of any one of Examples 1-8, wherein the first thickness is at least two times greater than the second thickness.

Example 10 is a printed circuit board comprising the integrated circuit of any one of Examples 1-9.

Example 11 is an electronic device that includes a chip package comprising one or more dies. At least one of the one or more dies includes a semiconductor device having a semiconductor region extending in a first direction from a source or drain region, and a gate structure extending in a second direction over the semiconductor region, and a conductive contact on at least a top surface of the source or drain region. The conductive contact has a first section directly above the source or drain region and a second section extending away from the source or drain region such that the source or drain region is not below the second section. The first section has a first thickness and the second section has a second thickness with the first thickness being greater than the second thickness by 10 nm or more.

Example 12 includes the electronic device of Example 11, wherein the semiconductor region comprises a plurality of semiconductor nanoribbons.

Example 13 includes the electronic device of Example 12, wherein the plurality of semiconductor nanoribbons comprise germanium, silicon, or a combination thereof.

Example 14 includes the electronic device of any one of Examples 11-13, wherein a top surface of the first section of the conductive contact is substantially coplanar with a top surface of the second section of the conductive contact.

Example 15 includes the electronic device of any one of Examples 11-14, wherein the source or drain region is a first source or drain region and the second section of the conductive contact extends over a second source or drain region from an adjacent semiconductor device.

Example 16 includes the electronic device of Example 15, wherein the first source or drain region has a different dopant type (n or p) than the second source or drain region.

Example 17 includes the electronic device of any one of Examples 11-16, wherein the at least one of the one or more dies further comprises a conductive via that contacts a top surface of the second section of the conductive contact.

Example 18 includes the electronic device of any one of Examples 11-17, wherein both the first and second sections of the conductive contact comprise a conductive liner and a conductive fill.

Example 19 includes the electronic device of any one of Examples 11-18, wherein the first thickness is at least two times greater than the second thickness.

Example 20 includes the electronic device of any one of Examples 11-19, further comprising a printed circuit board, wherein the chip package is coupled to the printed circuit board.

Example 21 is a method of forming an integrated circuit. The method includes forming a fin comprising semiconductor material, the fin extending above a substrate and extending in a first direction; forming a source or drain region at one end of the fin; forming a dielectric fill extending in a second direction over the source or drain region; forming a first recess through the dielectric fill and over the source or drain region, the first recess having a first height that exposes at least a top surface of the source or drain region; forming a second recess through the dielectric fill directly adjacent to the first recess, the second recess having a second height that is less than the first height; and forming a conductive contact within both the first recess and the second recess, such that the conductive contact contacts at least the top surface of the source or drain region.

Example 22 includes the method of Example 21, further comprising forming a conductive via on a portion of the conductive contact within the second recess.

Example 23 includes the method of Example 21 or 22, wherein forming the conductive contact comprises forming a conductive liner within the first recess and the second recess and forming a conductive fill on the conductive liner.

Example 24 includes the method of any one of Examples 21-23, wherein the first height is at least two times greater than the second height.

Example 25 includes the method of any one of Examples 21-24, further comprising polishing a top surface of a portion of the conductive contact in the first recess and a portion of the conductive contact in the second recess using chemical mechanical polishing (CMP).

Example 26 is an integrated circuit that includes a first semiconductor device having a first semiconductor region extending in a first direction from a first source or drain region, a second semiconductor device having a second semiconductor region extending in the first direction from a second source or drain region with the second source or drain region being adjacent to the first source or drain region along a second direction orthogonal to the first direction, and a conductive contact on at least a top surface of the first source or drain region. The conductive contact has a first section directly above the first source or drain region and a second section extending away from the source or drain region and over, but not contacting, the second source or drain region. The first section has a first thickness and the second section has a second thickness with the first thickness being at least 5 nm greater than the second thickness.

Example 27 includes the integrated circuit of Example 26, wherein the first semiconductor region comprises a first plurality of semiconductor nanoribbons and the second semiconductor region comprises a second plurality of semiconductor nanoribbons.

Example 28 includes the integrated circuit of Example 27, wherein the first plurality of semiconductor nanoribbons and the second plurality of semiconductor nanoribbons comprise germanium, silicon, or a combination thereof.

Example 29 includes the integrated circuit of any one of Examples 26-28, wherein a top surface of the first section of the conductive contact is substantially coplanar with a top surface of the second section of the conductive contact.

Example 30 includes the integrated circuit of any one of Examples 26-29, wherein the first source or drain region has a different dopant type (n or p) than the second source or drain region.

Example 31 includes the integrated circuit of any one of Examples 26-30, further comprising a conductive via that contacts a top surface of the second section of the conductive contact.

Example 32 includes the integrated circuit of any one of Examples 26-31, wherein both the first and second sections of the conductive contact comprise a conductive liner and a conductive fill.

Example 33 includes the integrated circuit of any one of Examples 26-32, wherein the first thickness is at least two times greater than the second thickness.

Example 34 is a printed circuit board comprising the integrated circuit of any one of Examples 26-33.

The foregoing description of the embodiments of the disclosure has been presented for the purposes of illustration and description. It is not intended to be exhaustive or to limit the disclosure to the precise forms disclosed. Many modifications and variations are possible in light of this disclosure. It is intended that the scope of the disclosure be limited not by this detailed description, but rather by the claims appended hereto.

What is claimed is:

1. An integrated circuit comprising:

a semiconductor device having a semiconductor region extending in a first direction from a source or drain region, and a gate structure extending in a second direction over the semiconductor region; and a conductive contact on at least a top surface of the source or drain region, wherein the conductive contact has a first section directly above the source or drain region, a second section extending away from the source or drain region such that the source or drain region is not below the second section, and a third section directly between the first section and the second section, wherein the first section has a first thickness and the second section has a second thickness, the first thickness being greater than the second thickness by 5 nm or more, and wherein the third section has a greater thickness than the first section.

2. The integrated circuit of claim 1, wherein the third section of the conductive contact is on a sidewall of the source or drain region.

3. The integrated circuit of claim 1, wherein a top surface of the first section of the conductive contact is substantially coplanar with each of a top surface of the second section of the conductive contact and a top surface of the third section of the conductive contact, and a bottom surface of the first section of the conductive contact is not coplanar with a bottom surface of the second section of the conductive contact and a bottom surface of the third section of the conductive contact.

4. The integrated circuit of claim 1, wherein the source or drain region is a first source or drain region and the second section of the conductive contact extends over a second source or drain region of an adjacent semiconductor device.

5. The integrated circuit of claim 4, wherein the first source or drain region has a different dopant type (n or p) than the second source or drain region.

6. The integrated circuit of claim 1, further comprising a conductive via that contacts a top surface of the second section of the conductive contact.

7. The integrated circuit of claim 1, wherein the first, the second, and the third sections of the conductive contact comprise a continuous conductive liner and a continuous and monolithic body of conductive fill.

8. A printed circuit board comprising the integrated circuit of claim 1.

9. An electronic device, comprising:

a chip package comprising one or more dies, at least one of the one or more dies comprising a semiconductor device having a semiconductor region extending in a first direction from a source or drain region, and a gate structure extending in a second direction over the semiconductor region; and a conductive contact on at least a top surface of the source or drain region, wherein the conductive contact has a first section directly above the source or drain region, a second section extending away from the source or drain region such that the source or drain region is not below the second section, and a third section directly between the first section and the second section, wherein the first section has a first thickness and the second section has a second thickness, the first thickness being at least 10 nm greater than the second thickness, and wherein the third section has a greater thickness than the first section.

10. The electronic device of claim 9, wherein a top surface of the first section of the conductive contact is substantially coplanar with each of a top surface of the second section of the conductive contact and a top surface of the third section of the conductive contact.

11. The electronic device of claim 9, wherein the source or drain region is a first source or drain region and the second section of the conductive contact extends over a second source or drain region from an adjacent semiconductor device.

12. The electronic device of claim 9, wherein the at least one of the one or more dies further comprises a conductive via that contacts a top surface of the second section of the conductive contact.

13. The electronic device of claim 9, wherein the first thickness is at least two times greater than the second thickness.

14. The electronic device of claim 9, further comprising a printed circuit board, wherein the chip package is coupled to the printed circuit board.

15. An integrated circuit comprising:

a first semiconductor device having a first semiconductor region extending in a first direction from a first source or drain region;

a second semiconductor device having a second semiconductor region extending in the first direction from a second source or drain region, the second source or drain region being adjacent to the first source or drain region along a second direction orthogonal to the first direction; and a conductive contact on at least a top surface of the first source or drain region, wherein the conductive contact has a first section directly above the first source or drain region and a second section extending away from the source or drain region and over, but not contacting, the second source or drain region, and wherein the first section has a first thickness and the second section has a second thickness, the first thickness being at least 5 nm greater than the second thickness, and wherein the conductive contact has a foot structure directly between the first section and the second section, the foot structure having a greater thickness than the first section.

16. The integrated circuit of claim 15, wherein a top surface of the first section of the conductive contact is substantially coplanar with a top surface of the second section of the conductive contact.

17. The integrated circuit of claim 15, wherein the first source or drain region has a different dopant type (n or p) than the second source or drain region.

18. The integrated circuit of claim 15, further comprising a conductive via that contacts a top surface of the second section of the conductive contact.

19. The integrated circuit of claim 15, wherein both the first and second sections and the foot structure of the conductive contact comprise a conductive liner and a conductive fill.

20. The integrated circuit of claim 15, wherein the first thickness is at least two times greater than the second thickness.

* * * * *